US009890991B2

(12) United States Patent
Gomes et al.

(10) Patent No.: US 9,890,991 B2
(45) Date of Patent: Feb. 13, 2018

(54) DOMESTIC APPLIANCE INCLUDING PIEZOELECTRIC COMPONENTS

(71) Applicant: Whirlpool Corporation, Benton Harbor, MI (US)

(72) Inventors: Alberto R. Gomes, Atlanta, GA (US); Yen-Hsi Lin, Saint Joseph, MI (US); Andrew M. Tenbarge, Saint Joseph, MI (US)

(73) Assignee: Whirlpool Corporation, Benton Harbor, MI (US)

(*) Notice: Subject to any disclaimer, the term of this patent is extended or adjusted under 35 U.S.C. 154(b) by 403 days.

(21) Appl. No.: 14/211,816

(22) Filed: Mar. 14, 2014

(65) Prior Publication Data

US 2014/0268648 A1 Sep. 18, 2014

Related U.S. Application Data

(60) Provisional application No. 61/781,946, filed on Mar. 14, 2013, provisional application No. 61/825,138, filed on May 20, 2013, provisional application No. 61/825,144, filed on May 20, 2013.

(51) Int. Cl.

| | |
|---|---|
| ***H01L 41/113*** | (2006.01) |
| ***F25D 27/00*** | (2006.01) |
| ***F21V 33/00*** | (2006.01) |
| ***F21V 23/04*** | (2006.01) |
| ***D06F 39/14*** | (2006.01) |
| *F25B 27/00* | (2006.01) |
| *F25D 23/02* | (2006.01) |

(52) U.S. Cl.

CPC ........... *F25D 27/005* (2013.01); *D06F 39/14* (2013.01); *F21V 23/0442* (2013.01); *F21V 33/0044* (2013.01); *F25B 27/00* (2013.01); *F25D 23/028* (2013.01)

(58) Field of Classification Search

CPC ............... H01L 41/113; H01L 41/1132; H01L 41/1134; H01L 41/1136; H01L 41/1138

USPC .................. 310/338, 339; 340/545.1, 545.6; 200/61.62, 61.76

See application file for complete search history.

(56) References Cited

U.S. PATENT DOCUMENTS

| | | | | |
|---|---|---|---|---|
| 5,913,951 | A | 6/1999 | Herr et al. | |
| 6,060,987 | A * | 5/2000 | Marlia | F25D 29/008 340/529 |
| 6,376,786 | B1 * | 4/2002 | Ishibashi | H01H 3/122 200/61.62 |
| 6,771,007 | B2 | 8/2004 | Tanielian | |
| 7,008,032 | B2 | 3/2006 | Chekal et al. | |
| 7,122,944 | B2 * | 10/2006 | Grimshaw | G08B 25/10 310/338 |
| 7,365,455 | B2 | 4/2008 | Hamel et al. | |
| 7,471,033 | B2 | 12/2008 | Thiesen et al. | |

(Continued)

FOREIGN PATENT DOCUMENTS

WO 2012121229 A1 9/2012

*Primary Examiner* — Derek Rosenau

(74) *Attorney, Agent, or Firm* — Price Heneveld LLP

(57) ABSTRACT

A domestic appliance such as a refrigerator, washing machine, and dryer is disclosed. The appliance may include a piezoelectric device. The piezoelectric device may be configured to supply electrical power to various electrically-powered elements in the appliance, such as a light source, a drive status sensor, and active balancing components.

17 Claims, 18 Drawing Sheets

(56) References Cited

U.S. PATENT DOCUMENTS

| | | | | |
|---|---|---|---|---|
| 7,649,305 | B2 | 1/2010 | Priya et al. | |
| 7,687,977 | B2 | 3/2010 | Xu | |
| 7,839,058 | B1 | 11/2010 | Churchill et al. | |
| 7,928,634 | B2 | 4/2011 | Fang | |
| 7,948,153 | B1 | 5/2011 | Kellogg et al. | |
| 8,011,255 | B2 | 9/2011 | Arms et al. | |
| 8,030,786 | B2 | 10/2011 | Jackson et al. | |
| 8,030,807 | B2 | 10/2011 | Gieras et al. | |
| 8,033,686 | B2 | 10/2011 | Recker et al. | |
| 8,704,427 | B2 * | 4/2014 | Futter | G06F 1/1616<br>310/339 |
| 2004/0055858 | A1 * | 3/2004 | Hoffman | H01R 13/514<br>200/61.62 |
| 2010/0060231 | A1 | 3/2010 | Trainor et al. | |
| 2010/0072759 | A1 | 3/2010 | Andosca et al. | |
| 2010/0106626 | A1 | 4/2010 | Ashrafzadeh et al. | |
| 2010/0298720 | A1 | 11/2010 | Potkay | |
| 2010/0307202 | A1 | 12/2010 | Maentele et al. | |
| 2011/0057547 | A1 | 3/2011 | Fain | |
| 2011/0095652 | A1 | 4/2011 | Winger et al. | |
| 2011/0210554 | A1 | 9/2011 | Boysel | |
| 2011/0215590 | A1 | 9/2011 | Arnold et al. | |
| 2011/0278991 | A1 | 11/2011 | Harigai et al. | |

* cited by examiner

DOMESTIC APPLIANCE INCLUDING PIEZOELECTRIC COMPONENTS

CROSS-REFERENCE TO RELATED U.S. PATENT APPLICATIONS

This application claims the benefit of U.S. Provisional Patent Application No. 61/781,946, filed on Mar. 14, 2013, U.S. Provisional Patent Application No. 61/825,138, filed on May 20, 2013, and U.S. Provisional Patent Application No. 61/825,144, filed on May 20, 2013, all of which are hereby incorporated by reference in their entirety.

TECHNICAL FIELD

The present disclosure relates generally to domestic appliances and more particularly to electronic components of a domestic appliance.

BACKGROUND

Domestic appliances perform various functions in consumer's homes. For example, a domestic refrigerator is an appliance used to store food items in a home at preset temperatures. A domestic refrigerator typically includes one or more temperature-controlled compartments into which food items may be placed to preserve the food items for later consumption. A domestic refrigerator also typically includes a number of electronic components that control and regulate various operations of the refrigerator.

An electric or gas dryer for laundry is an appliance used to dry clothes or other laundry. A dryer typically includes a rotating drum for tumbling the laundry and a gas heater or electric heating element for providing heat to dry the laundry. A dryer also typically includes a number of electronic components that control and regulate various operations of the dryer.

An electric washer for laundry is an appliance used to wash clothes or other laundry. A washer typically includes a rotating drum and a fluid inlet for providing washing fluid to wash laundry in the drum. A washer also typically includes a number of electronic components that control and regulate various operations of the washer.

SUMMARY

According to one aspect of the disclosure, a domestic appliance such as a refrigerator is disclosed. The refrigerator includes a cabinet defining a temperature-controlled compartment and a door positioned at a front of the cabinet. The door is moveable between an open position in which user-access to the temperature-controlled compartment is permitted and a closed position in which user-access to the temperature-controlled compartment is prevented. The refrigerator includes a sensor secured to the door. The sensor includes a piezoelectric device configured to generate electrical power when the door is moved from the open position to the closed position.

In some embodiments, the sensor may include a wireless transmitter electrically coupled to the piezoelectric device. The piezoelectric device may be configured to supply electrical power to the wireless transmitter when the door is moved between the open position and the closed position.

In some embodiments, the piezoelectric device may include a gasket configured to generate electrical power when compressed, and the sensor may include a plug extending outwardly from an opening defined in the door.

The plug may be moveable between a first position in which the plug compresses the gasket and a second position in which the plug is spaced apart from the gasket.

Additionally, in some embodiments, when the door is in the closed position, the plug may be in the first position, and when the door is in the open position, the plug may be in the second position.

In some embodiments, the refrigerator may include an electrical power generator including a second piezoelectric device extending between the door and the cabinet. The second piezoelectric device may be configured to generate electrical power when the door is moved from the closed position to the open position.

In some embodiments, the second piezoelectric device may include a body formed from a stretchable dielectric elastomer. In some embodiments, the body may have a first length when the door is closed and a second length when the door is open. The second length may be greater than the first length. In some embodiments, the second piezoelectric device may include a piezoelectric film element.

Additionally, in some embodiments, the refrigerator may include a battery. The second piezoelectric device may be configured to supply electrical power to the battery when the door is moved from the closed position to the open position.

According to another aspect, a domestic appliance includes a cabinet defining a compartment, a light source positioned in the compartment, and a door positioned at a front of the cabinet. The door is moveable between an open position in which user-access to the compartment is permitted and a closed position in which user-access to the compartment is prevented. The domestic appliance also includes a sensor secured to the door that includes a transmitter configured to generate an electrical signal when supplied with electrical power and a piezoelectric device configured to supply electrical power to the transmitter when the door is in the closed position. The domestic appliance includes a receiver configured to receive the electrical signal generated by the transmitter and an electronic controller coupled to the receiver and the light source. The controller is configured to detect the electrical signal from the transmitter and de-energize the light source when the electrical signal is detected.

In some embodiments, the piezoelectric device may include a gasket configured to generate electrical power when compressed. The sensor may include a plug extending outwardly from an opening defined in the door. The plug may be moveable between a first position in which the plug compresses the gasket and a second position in which the plug is spaced apart from the gasket.

In some embodiments, the domestic appliance may include an electrical power generator including a second piezoelectric device extending between the door and the cabinet. The second piezoelectric device may be configured to generate electrical power when the door is moved from the closed position to the open position. The domestic appliance may also include a power supply circuit operable to distribute electrical power generated by the electrical power generator to the light source.

Additionally, in some embodiments, the controller may be coupled to the power supply circuit. The controller may be configured to operate the power supply circuit to supply electrical power to the light source when the electrical signal is absent.

In some embodiments, the domestic appliance may include a battery coupled to the power supply circuit. The controller may be coupled to the power supply circuit and may be configured to operate the power supply circuit to supply electrical power to the battery.

According to another aspect, a method of operating a refrigerator appliance is disclosed. The method includes deflecting a piezoelectric device positioned on a door of the refrigerator appliance to generate a quantity of electrical power, communicating with a sensor to determine the quantity of electrical power generated by the piezoelectric device, and operating a light source of the refrigerator appliance based on the quantity of electrical power.

In some embodiments, operating the light source of the refrigerator appliance based on the quantity of electrical power may include de-energizing the light source when the quantity of electrical power is less than a predetermined value.

According to another aspect of the disclosure, a dryer appliance is disclosed. The dryer appliance includes a cabinet, and a drum mounted in the cabinet for rotation about a longitudinal axis. The drum includes a chamber sized to receive laundry. The dryer appliance also includes a drive mechanism positioned in the cabinet that is operable to rotate the drum about the longitudinal axis, an electronic controller configured to operate the drive mechanism, and a sensor positioned in the cabinet. The sensor includes a piezoelectric device that is configured to generate electrical power when the drum is rotated about the longitudinal axis.

In some embodiments, the sensor may include a wireless transmitter electrically coupled to the piezoelectric device. The wireless transmitter may be configured to generate an electrical signal when supplied with electrical power. The piezoelectric device may be configured to supply electrical power to the wireless transmitter when the drum is rotated about the longitudinal axis.

In some embodiments, the dryer appliance may include a receiver configured to receive the electrical signal generated by the transmitter. The electronic controller may be coupled to the receiver and the drive mechanism and may be configured to determine whether the electrical signal has been received from the transmitter and de-energize the drive mechanism when the electrical signal is not received.

In some embodiments, the drive mechanism may include a belt coupled to the drum and an idler assembly configured to tension the belt. The piezoelectric device may be secured to the idler assembly. Additionally, in some embodiments, the idler assembly may include an idler pulley and a biasing element configured to bias the belt into engagement with the idler pulley. The biasing element may be configured to deflect when the drum is rotated about the longitudinal axis. The piezoelectric device may be secured to the biasing element and may be configured to generate and supply electrical power to the transmitter when the biasing element is deflected.

In some embodiments, the piezoelectric device may include a body formed from a stretchable dielectric elastomer. Additionally, the body may be configured to expand from a first length to a second length when the biasing element is deflected.

In some embodiments, the dryer appliance may include a door positioned at a front of the cabinet. The door may be moveable between an open position in which user-access to the chamber of the drum is permitted and a closed position in which user-access to the chamber of the drum is prevented. The dryer appliance may also include an electrical power generator including a second piezoelectric device extending between the door and the cabinet. The second piezoelectric device may be configured to generate electrical power when the door is moved from the closed position to the open position.

In some embodiments, the dryer appliance may include a light source configured to illuminate the chamber of the drum, and a power supply circuit operable to distribute electrical power generated by the electrical power generator to the light source.

In some embodiments, the dryer appliance may include a battery coupled to the power supply circuit. The electronic controller may be coupled to the power supply circuit and may be configured to operate the power supply circuit to supply electrical power to the battery.

In some embodiments, the dryer appliance may include an air system configured to draw heated air through the chamber of the drum when the drum is rotated about the longitudinal axis. The air system may include a duct and a grill positioned between the chamber and the duct. The grill may include a plurality of openings that are sized to permit heated air drawn through the chamber to advance into the duct. When heated air is advanced into the duct through the openings of the grill, the piezoelectric device may be deflected such that the piezoelectric device generates a quantity of electrical power greater than zero watts.

In some embodiments, the air system may include a first wall having the grill defined therein. The duct may include a chute connected to the grill, an upper passageway having an end isolated from the chute, and a lower passageway connected to the chute and the upper passageway. The piezoelectric device may be positioned in the passageway. The piezoelectric device may be configured to deflect to a first degree of deflection when heated air is advanced into the lower passageway through the chute and the passageway and a second degree of deflection when the openings of the grill are substantially blocked and heated air is advanced into the lower passageway through the upper passageway. The second degree of deflection may be greater than the first degree of deflection and the quantity of electrical power generated by the piezoelectric device at the second degree of deflection may be greater than the quantity of electrical power generated at the first degree of deflection.

In some embodiments, the dryer appliance may include a filter removably coupled to the cabinet. The filter may include a screen and may be moveable between a first position in which the screen is positioned in the chute and a second position in which the screen is removed from the chute.

In some embodiments, the piezoelectric device may be configured to deflect to a third degree of deflection when the filter is in the second position and heated air is advanced into the chute and the upper passageway. The third degree of deflection may be less than the first degree of deflection and the quantity of electrical power generated by the piezoelectric device at the third degree of deflection may be less than the quantity of electrical power generated at the first degree of deflection.

In some embodiments, the sensor may be configured to generate an electrical signal indicative of the quantity of electrical power generated by the piezoelectric device.

In some embodiments, the electronic controller may be configured to communicate with the sensor to determine the quantity of electrical power generated by the piezoelectric device, compare the quantity of electrical power to a predetermined value, and de-energize the drive mechanism when the quantity of electrical power generated by the piezoelectric device is less than the predetermined value.

According to another aspect, a domestic appliance is disclosed. The appliance includes a drum mounted for rotation about a longitudinal axis and including a chamber sized to receive laundry. The appliance also includes a drive mechanism operable to rotate the drum about the longitudinal axis. The drive mechanism includes an idler pulley, a belt engaged with the drum and the idler pulley, and a biasing element configured to bias the belt into engagement with the idler pulley. The biasing element is configured to deflect when the drum is rotated about the longitudinal axis.

The domestic appliance also includes a sensor including a transmitter configured to generate an electrical signal when supplied with electrical power, and a piezoelectric device secured to the biasing element. The piezoelectric device is configured to supply electrical power to the transmitter when the biasing element is deflected. The appliance includes a receiver configured to receive the electrical signal generated by the transmitter and an electronic controller coupled to the receiver and the drive mechanism. The electronic controller is configured to detect the electrical signal from the transmitter and de-energize the drive mechanism when the electrical signal is not detected.

According to another aspect, a method of operating a dryer appliance is disclosed. The method includes deflecting a piezoelectric device positioned in a cabinet of the dryer appliance to generate a quantity of electrical power, communicating with a sensor to determine the quantity of electrical power generated by the piezoelectric device, and operating a drive mechanism of the dryer appliance based on the quantity of electrical power.

In some embodiments, deflecting the piezoelectric device to generate the quantity of electrical power may include advancing heated air through a passageway defined in the cabinet to bend the piezoelectric device. In some embodiments, operating the drive mechanism of the dryer appliance based on the quantity of electrical power may include de-energizing the drive mechanism when the quantity of electrical power is less than a predetermined value.

According to another aspect of the disclosure, a laundry appliance is disclosed. The laundry appliance includes a tub configured to contain a washing fluid and a drum mounted for rotation within the tub about a longitudinal axis. The drum includes a chamber sized to receive laundry. The laundry appliance also includes a drive mechanism operable to rotate the drum about the longitudinal axis, an electronic controller configured to operate the drive mechanism, and a piezoelectric power generator configured to generate electrical power when the drum is rotated about the longitudinal axis.

In some embodiments, the laundry appliance may include an electrical component powered by the piezoelectric power generator. In such an embodiment, the piezoelectric power generator may be mounted on the drum. The electrical component may be powered solely by the piezoelectric power generator.

In some embodiments, the laundry appliance may include an active balancing system to balance a load in the drum, and the active balancing system may include the electrical component. The drum may include a plurality of compartments defined therein in which each compartment is configured to receive fluid. The drum may also include an electrically-operated pump configured to move the fluid between the plurality of compartments to balance the load in the drum. In such an embodiment, the electrical component may include the electrically-operated pump.

In some embodiments, the drum may include a plurality of balance balls configured to balance a load in the drum and an electrically-operated actuator configured to regulate the plurality of the balance balls. In such an embodiment, the electrical component may include the electrically-operated actuator. In some embodiments, the electrically-operated actuator may include a sensor having a second piezoelectric power generator. The sensor may be configured to transmit a signal associated with electrical power generated by the second piezoelectric power generator to the electronic controller.

In some embodiments, the sensor may include a wireless transmitter electrically coupled to the second piezoelectric power generator. The wireless transmitter may be configured to transmit a signal to the electronic controller when supplied with electrical power from the second piezoelectric power generator. In some embodiments, the drum may include a baffle extending from an inner wall that defines the chamber and the piezoelectric power generator may be mounted on the blade and configured to generate the electrical power when the blade is deflected. In such an embodiment, the baffle may include a blade configured to engage contents of the chamber of the drum and to deflect from a force applied to the blade by the contents when the drum is rotated.

In some embodiments, the laundry appliance may include a cabinet, a damper, and an electrical component. The damper may be mounted in the cabinet and may include a first end coupled to the cabinet and a second end coupled to the tub. The electrical component may be powered by the piezoelectric power generator and may include a force sensor configured to sense a force applied to the damper. Additionally, the piezoelectric power generator may be coupled to the damper.

In some embodiments, the laundry appliance may include a cabinet and a seal. In such an embodiment, the seal may be coupled to the cabinet and to a rim of the tub at an end defining an opening to the chamber. Additionally, the piezoelectric power generator may be coupled to the seal and configured to generate the electrical power based on stretching of the seal. In some embodiments, the laundry appliance may include a mold sensor coupled to the seal and configured to detect a presence of mold.

In some embodiments, the piezoelectric power generator may include a body formed from a stretchable dielectric elastomer. In another embodiment, the laundry appliance may include a power supply circuit electrically coupled to the piezoelectric power generator. Additionally, the power supply circuit may be operable to store and distribute electrical power generated by the piezoelectric power generator. The power supply circuit may include at least one of a battery and a capacitor.

According to another aspect, another laundry appliance is disclosed. The appliance includes a tub, a drum, a drive mechanism, a piezoelectric power generator, and an electronic controller. The tub is configured to contain a washing fluid. The drum is mounted for rotation within the tub about the longitudinal axis, and includes a chamber sized to receive laundry. The drive mechanism is operable to rotate the drum about the longitudinal axis. Additionally, the piezoelectric power generator is positioned on the drum and is configured to generate an electrical signal when the drum is rotated about the longitudinal axis. The electronic controller is configured to operate the drive mechanism based on the electrical signal received from the piezoelectric power generator.

In some embodiments, the drum may include a plurality of compartments defined therein. Each compartment may be configured to receive fluid. Additionally, the drum may include an electrically-operated pump configured to move the fluid between the plurality of compartments to balance the load in the drum. Further, the piezoelectric power generator may be electrically coupled to the electrically-operated pump. In some embodiments, the drum may include a plurality of balance balls configured to balance a load in the drum and an electrically-operated actuator configured to regulate the plurality of the balance balls. In such an embodiment, the piezoelectric power generator may be electrically coupled to the electrically-operated actuator.

According to another aspect, a method for utilizing power in a laundry appliance is disclosed. The method includes operating a laundry appliance to rotate a drum containing laundry and wash fluid about a longitudinal axis, generating electrical power from a piezoelectric power generator based on movement of a component of the laundry appliance, and supplying electrical power generated by the piezoelectric power generator to an electrical component of the laundry appliance. In some embodiments, the piezoelectric power generator may be mounted on the drum.

BRIEF DESCRIPTION OF THE DRAWINGS

The detailed description particularly refers to the following figures, in which.

DETAILED DESCRIPTION OF THE DRAWINGS

Figure 1:
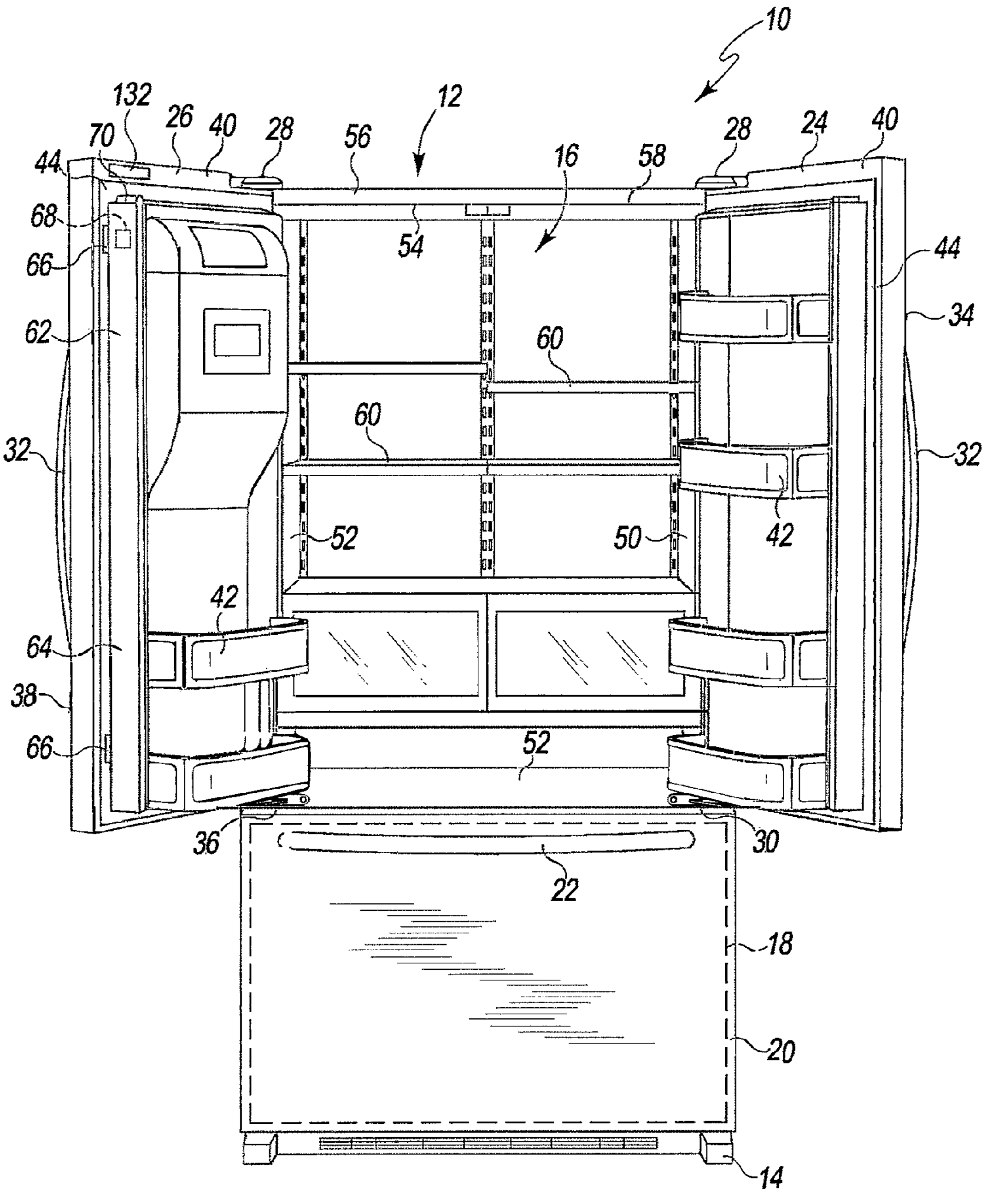
FIG. 1 is a front elevation view of a domestic refrigerator.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the disclosure.

Referring to FIG. 1, a home appliance is shown as a domestic refrigerator appliance 10 (hereinafter refrigerator 10). The refrigerator 10 includes a cabinet 12 and a lower frame 14 that supports the cabinet 12. The refrigerator cabinet 12 defines a temperature-controlled, refrigerated compartment 16 into which a user may place and store food items such as milk, cheese, produce, etcetera. The refrigerated compartment 16 is operable to maintain stored food items at a predefined temperature.

As shown in FIG. 1, the refrigerator cabinet 12 defines a temperature-controlled freezer compartment 18, which is also operable to maintain food items stored therein at a certain temperature. The refrigerator 10 includes a drawer 20 that permits user access to the freezer compartment 18 such that food items may be placed in and retrieved from shelves and drawers positioned therein. When the drawer 20 is in the closed position shown in FIG. 1, user access to the freezer compartment 18 is prevented. A handle 22 is located on the drawer 20, and the user may use the handle 22 to pull the drawer 20 open. It will be appreciated that in other embodiments the freezer compartment may be positioned above or side-by-side with the refrigerated compartment 16, either as a free standing refrigerator or a built-in refrigerator. It will be further appreciated that in other embodiments the refrigerator 10 may not have a freezer compartment. It should also be appreciated that the concepts described herein may be included in a stand-alone freezer such as, for example, a chest freezer. The concepts described herein also may be included in other domestic appliances such as, for example, microwaves, ovens, dishwashers, laundry appliances, and so forth.

The refrigerator 10 includes a right-hand door 24 and a left-hand door 26 that permit user access to the refrigerated compartment 16 such that food items may be placed in and retrieved from the refrigerator 10. The right-hand door 24 is hinged to the front of the refrigerator cabinet 12 via an upper hinge assembly 28 and a lower hinge assembly 30. A handle 32 is located on a front panel 34 of the door 24, and the user may use the handle 32 to pull the right-hand door 24 open. The left-hand door 26 is hinged to the front of the refrigerator cabinet 12 via another upper hinge assembly 28 and a lower hinge assembly 36. Another handle 32 is located on a front panel 38 of the door 26, and the user may use that handle 32 to pull the left-hand door 26 open. Each of the doors 24, 26 also includes a back panel 40 and a number of shelves 42 extending from back panel 40. A gasket 44 is attached to each of the doors 24, 26 at the outer perimeter of the back panel 40.

The cabinet 12 of the refrigerator 10 includes a number of side walls 50 that extend upwardly from a bottom wall 52 to a top wall 54. The walls 50, 52, 54 cooperate to define the refrigerated compartment 16. As shown in FIG. 1, a number of shelves 60 are positioned in the compartment 16. The cabinet 12 has an open front side 56 that defines an access opening 58, which provides user access to shelves 42, 60 of the refrigerator 10 when either of the doors 24, 26 is open. When the doors 26 are closed, the gaskets 44 cooperate with a mullion bar 62 to seal the access opening 58 and thereby prevent the user from accessing the shelves 42, 60 and preventing chilled air from escaping through the access opening 58.

Figure 2:
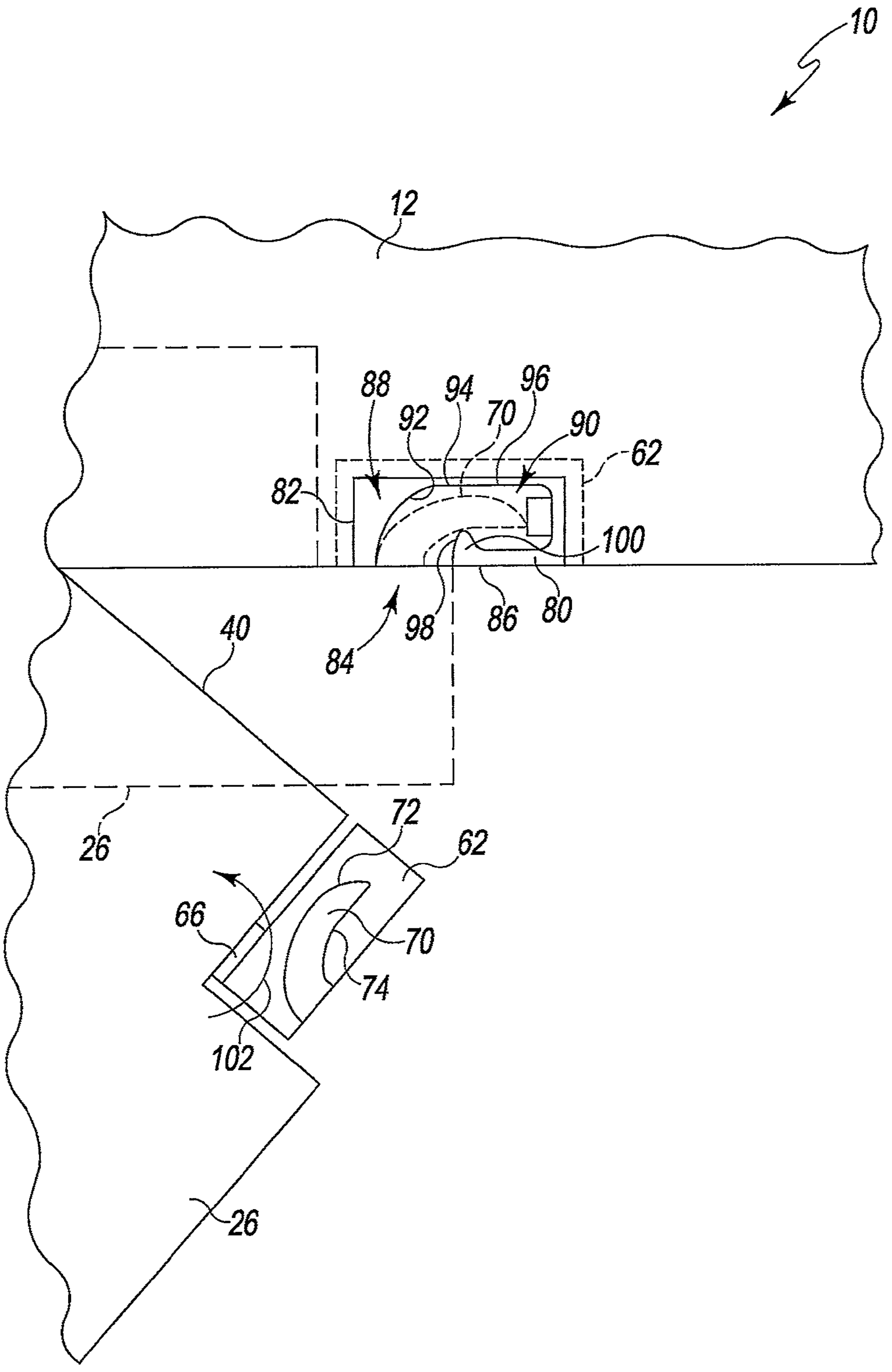
FIG. 2 is a top plan view of the domestic refrigerator of FIG. 1 showing a door in an open position and a closed position.

In the illustrative embodiment, the mullion bar 62 includes a central body 64 that is attached to the left-hand door 26 via a pair of hinges assemblies 66. It should be appreciated that in other embodiments the mullion bar 62 may be secured to the right-hand door 24. As shown in FIGS. 1 and 2, the mullion bar 62 is configured to pivot between a retracted position (shown in solid line) when the door 26 is open and an extended position (shown in broken line) when the door 26 is closed, as described in greater detail below. The refrigerator 10 includes a locking mechanism 68 for the mullion bar 62. The locking mechanism 68 retains the mullion bar 62 in the retracted position when the door 26 is open and releases the mullion bar 62 to move to the extended position as the door 26 is closed. The locking mechanism 68 may be embodied as a magnetic retaining element, spring biased lock, or other mechanism. One example of a locking mechanism 68 is shown and described in U.S. Pat. No. 7,008,032 entitled "Refrigerator Incorporating French Doors With Rotating Mullion Bar," which issued on Mar. 7, 2006 and is incorporated herein by reference.

A guide pin 70 extends upwardly from the central body 64 of the mullion bar 62. As shown in FIG. 2, the guide pin 70 includes a front cam surface 72 and a rear cam surface 74 positioned opposite the front cam surface 72. In the illustrative embodiment, the front cam surface 72 is a convex, curved surface, and the rear cam surface 74 is a concave, curved surface. It should be appreciated that in other embodiments the surfaces 72, 74 may include one or more flat surfaces.

The guide pin 70 is received in a guide block 80 when the door 26 is closed. As shown in FIG. 2, the guide block 80 includes an outer wall 82 that extends downwardly from the top wall 54 of the cabinet 12. An opening 84 is defined in the front surface 86 of the outer wall 82. A number of guide surfaces 88 extend inwardly from the opening 84 to define a slot or track 90 sized to receive guide pin 70. The guide surfaces 88 include a sloping curved surface 92 that extends inwardly from the opening 84 to an edge 94. The guide surfaces 88 also include a substantially flat surface 96 that is connected to the surface 92 at the edge 94. A convex surface 98 is positioned opposite the surface 92, and the surface 98 defines a projection 100 extending into the track 90.

When the door 26 is in the closed position shown in FIG. 2, the mullion bar 62 is in the extended position, and the rear cam surface 74 of the guide pin 70 engages the projection 100 of the guide block 80. As the door 26 is opened, the guide pin 70 is forced to pivot around the projection 100, thereby causing the central body 64 of the mullion bar 62 to rotate in the direction indicated by arrow 102 from the extended position to the retracted position. Once the mullion bar 62 is in the retracted position, the locking mechanism 68 retains the bar 62 in that position until the door 26 is closed.

When the door 26 is moved from the open position to the closed position, the guide pin 70 is passed through the opening 84 of the guide block 80, and the front cam surface 72 is advanced into contact with the curved surface 92 of the block 80. The engagement between the front cam surface 72 and the curved surface 92 causes the guide pin 70 to pivot, thereby causing the central body 64 of the mullion bar 62 to rotate from the retracted position. As the mullion bar 62 is rotated, the front cam surface 72 advances along the curved surface 92 and the flat surface 96, and the rear cam surface 74 of the guide pin 70 engages the projection 100. When the mullion bar 62 is in the extended position, the rear cam surface 74 of the guide pin 70 engages the projection 100 of the guide block 80 as shown in FIG. 2.

Figure 3:
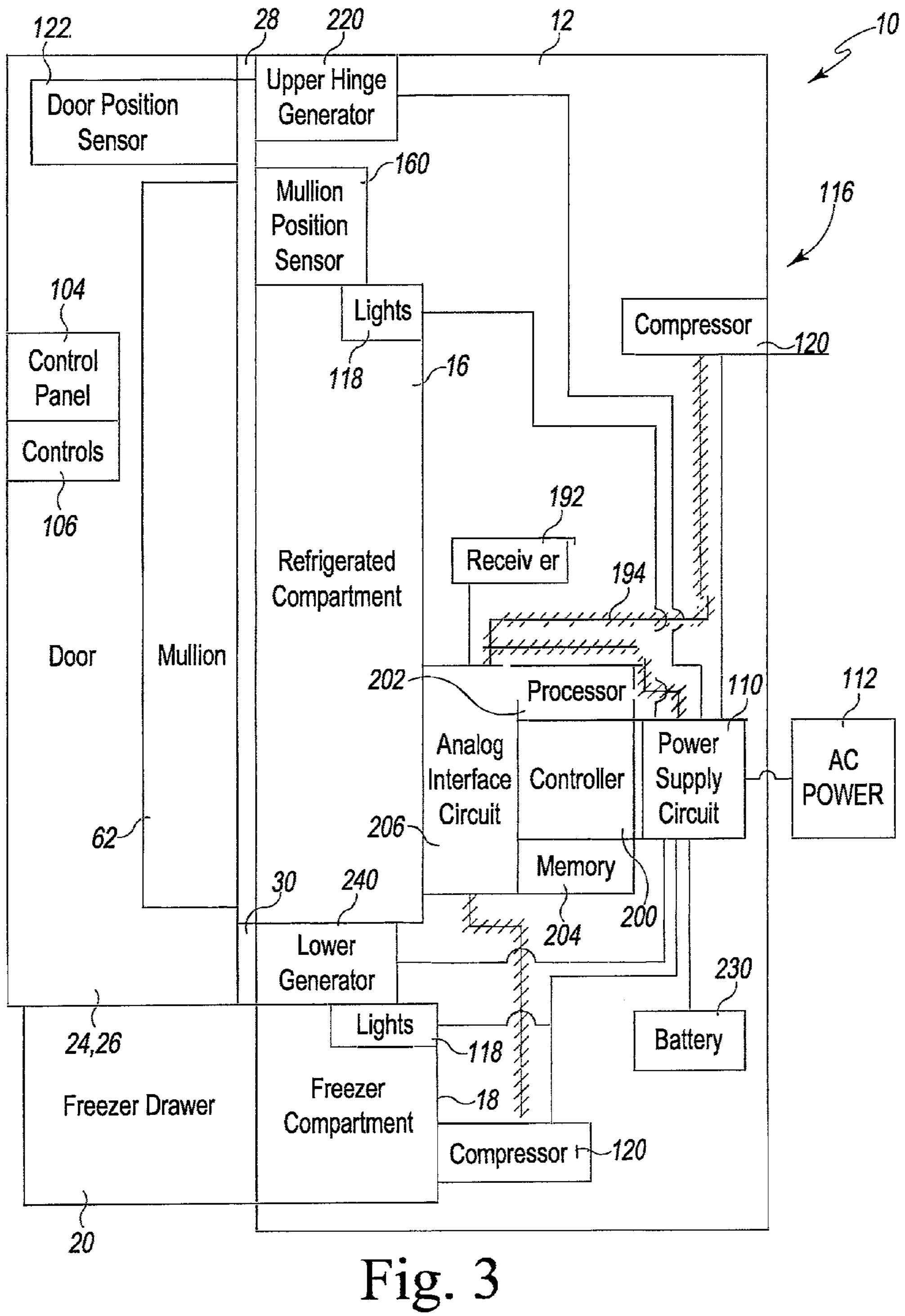
FIG. 3 is a block diagram of the domestic refrigerator of FIG. 1.

Referring now to FIG. 3, the refrigerator 10 is shown in a simplified block diagram. The refrigerator 10 includes a control panel 104 that is secured to the door 26. The control panel 104 includes a number of controls 106, such as buttons, knobs, and/or a touchscreen panel that are used to control the operation of the refrigerator 10. In other embodiments, the touchscreen panel may be the sole control located on the control panel 104, thus permitting a user to control all user accessible operations of the refrigerator 10 via the touchscreen panel. Additionally, in other embodiments, the control panel 104 may include a display panel such as a liquid crystal display (LCD) panel or some other type of display panel along with one or more buttons associated with the display panel that may be actuated to control operation of the refrigerator 10. In other embodiments, the control panel may include only buttons and knobs that may be actuated to control operation of the refrigerator 10.

The refrigerator 10 also includes a power supply circuit 110. The components of the power supply circuit 110 may be located in any suitable portion of the refrigerator 10, including, but not limited to, the lower frame 14 or the cabinet 12. It should be appreciated that the power supply circuit 110 may include components, sub-components, and devices other than those shown in FIG. 3, which are not illustrated for clarity of the description.

As shown in FIG. 3, the power supply circuit 110 may be electrically coupled to an AC mains power source 112, such as, for example, an electrical outlet commonly found in residential homes. The AC mains power source 112 is electrically coupled to a DC power converter of the power supply circuit 110 via a number of signal paths. These signal paths and other signal paths illustrated in FIG. 3 may be embodied as any type of signal paths capable of communicating electrical signals between the components of the power supply circuit 110. For example, the signal paths may be embodied as any number of wires, cables, printed circuit board traces, bus, intervening devices, and/or the like.

The power supply circuit 110 is electrically coupled to a number of electrical components 116 of the refrigerator 10. In the illustrative embodiment, the electrical components 116 include a plurality of lighting devices 118 for illuminating food items placed in the refrigerated compartment 16 and another plurality of lighting devices 118 for illuminating food items placed in the freezer compartment 18. The electrical components 116 also include a compressor 120 that is operable to regulate the temperature of the refrigerated compartment 16 and the temperature of the freezer compartment 18.

Figure 4:
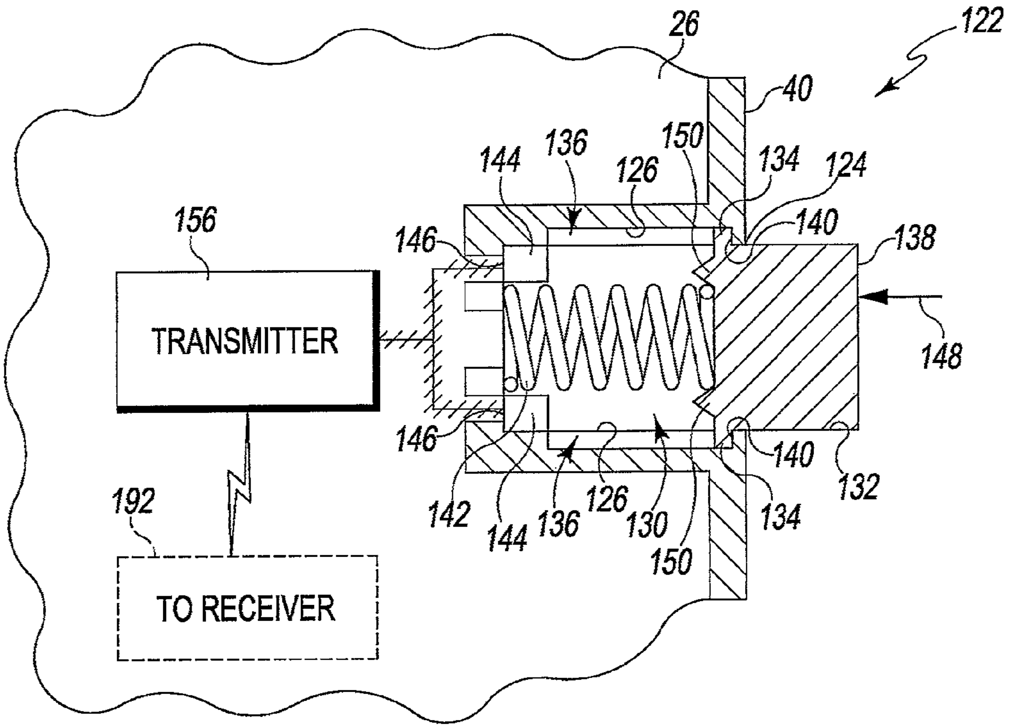
FIG. 4 is a diagrammatic top plan view of a door position sensor of the domestic refrigerator of FIG. 1.

A door position sensor 122 is attached to the door 26 to indicate the position of the door 26 relative to the cabinet 12. It should be appreciated that in the illustrative embodiment the door 24 also has a door position sensor (not shown) attached thereto that indicates the position of the door 24 relative to the cabinet 12. As shown in FIGS. 1 and 4, the back panel 40 of the door 26 has an opening 124 defined therein, and a number of inner walls 126 extend inwardly from the opening 124 to define an aperture 130 in the door 26. The position sensor 122 includes a plug 132 that is positioned in the aperture 130. In the illustrative embodiment, a pair of guide pins 134 extend outwardly from the plug 132, and each guide pin 134 is received in a corresponding slot 136 defined in each inner wall 126 of the door 26.

The plug 132 is configured to move relative to the opening 124 between an extended position when the door 26 is open and a retracted position when the door 26 is closed. When the plug 132 is in the retracted position (i.e., the door 26 is closed), the outer face 138 of the plug 132 is aligned with the back panel 40. When the plug 132 is in the extended position (i.e., the door 26 is open) shown in FIG. 4, the plug 132 extends outwardly from the opening 124, and the pins 134 engage stops 140 formed at the ends of the slots 136 such that the plug 132 is retained in the aperture 130. In the illustrative embodiment, the position sensor 122 also includes a biasing element such as, for example, spring 142 configured to bias the plug 132 in the extended position.

The position sensor 122 also includes an array of piezoelectric elements 144 that are positioned in the aperture 130. Each piezoelectric element 144 is configured to generate electrical power when the plug 132 is moved between the extended position and the retracted position. Each of the piezoelectric elements 144 is embodied as a compressible gasket 146, which is formed from a piezoelectric ceramic, such as, for example, lead zirconate titanate (PZT). As shown in FIG. 4, the plug 132 includes a rib 150, which is configured to engage and compress each gasket 146 as the plug 132 is moved to the retracted position. When each piezoelectric gasket 146 is compressed, electrical power is generated. It should be appreciated that in other embodiments the piezoelectric element may take other forms, such as, for example, a piezoelectric disk that generates a voltage when deformed. In other embodiments, the piezoelectric element may also be formed from an electroactive polymer (EAP) such as, for example, a stretchable dielectric elastomer.

In the illustrative embodiment, the spring 142 biases the plug 132 in the extended position. When a sufficient force is applied in the direction indicated by arrow 148 such as, for example, when the door 26 is closed, the bias exerted by the spring 142 is overcome, and the plug 132 is moved from the extended position. The rib 150 is advanced into engagement with gaskets 146, and the gaskets 146 are compressed as the plug 132 is moved to the retracted position. When the plug 132 is in the retracted position, the piezoelectric elements 144 generate a predetermined amount of electrical power. In the illustrative embodiment, the predetermined amount or quantity of power is approximately 1 Watt. It should be appreciated that in other embodiments the power may range from approximately 500 μW to 1 Watt. When the door 26 is opened, the bias exerted by the spring 142 urges the plug 132 outward to the extended position, thereby permitting the gaskets 146 to expand.

The piezoelectric gaskets 146 of the position sensor 122 are electrically connected to transmitter circuitry 156. The transmitter circuitry 156 is configured to transmit a wireless data signal when energized. In the illustrative embodiment, the transmitter circuitry 156 uses a Bluetooth transmission protocol. The electrical power generated by the piezoelectric gaskets 146 energizes the transmitter circuitry 156 such that the wireless data signal is transmitted. In that way, the position sensor 122 does not require power from the power supply circuit 110 (and hence the AC mains power source 112).

In use, when the door 26 is closed, the transmitter circuitry 156 is energized and generates the wireless data signal. Alternatively, when the door 26 is opened, piezoelectric gaskets 146 are permitted to expand such that the electrical power generated is decreased. As a result, the transmitter circuitry 156 is de-energized such that no wireless data signal is generated.

In other embodiments, the transmitter circuitry 156 may be configured to transmit via a local area network, infrared communication, or other wireless communication protocol. It should also be appreciated that in other embodiments the transmitter circuitry 156 may be replaced with a Radio-Frequency Identification (RFID) tag. When the piezoelectric elements 144 are generating electrical power, the RFID tag may be energized to transmit a wireless signal.

Figure 5:
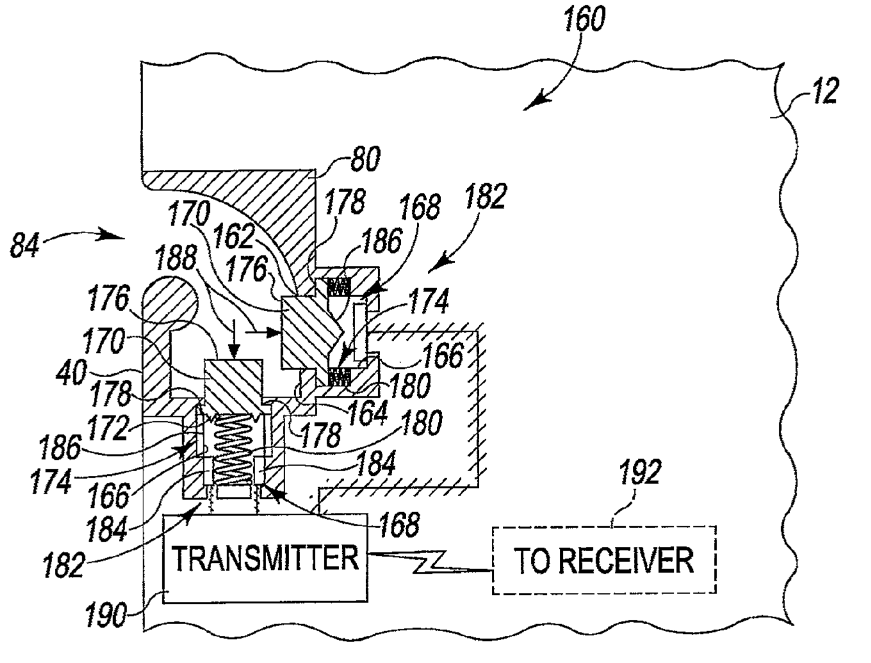
FIG. 5 is a diagrammatic top plan view of a mullion position sensor of the domestic refrigerator of FIG. 1.

The refrigerator 10 also includes a mullion position sensor 160, which indicates the position of the mullion bar 62. As shown in FIG. 5, the guide block 80 of the refrigerator 10 has a pair of openings 162 defined in a guide surface 164 thereof. A number of inner walls 166 extend inwardly from each opening 162 to define a pair of apertures 168 in the guide block 80. The position sensor 160 includes a plug 170 that is positioned in each aperture 168. In the illustrative embodiment, a pair of pins 172 extend outwardly from each plug 170, and each pin 172 is received in a corresponding slot 174 defined in each inner wall 166 of the guide block 80.

Each plug 170 is configured to move relative to the opening 162 between a retracted position and an extended position. When the door 26 is closed and the mullion bar 62 is positioned in the guide block 80, the plugs 170 are in the retracted position. The plugs 170 are in the extended position when the door 26 is open and the mullion bar 62 is spaced apart from the guide block 80. In the illustrative embodiment, the guide pin 70 of the mullion bar 62 engages the outer face 176 of each plug 170 when the bar 62 is positioned in the guide block 80. When the plugs 170 are in the extended position (i.e., the door 26 is open), the plugs 170 extends outwardly from the openings 162, and the pins 172 engage stops 178 formed at the ends of the slots 174 such that the plugs 170 are retained in the apertures 168. In the illustrative embodiment, the position sensor 122 also includes a biasing element such as, for example, spring 180 configured to bias each plug 170 in the extended position.

The position sensor 160 also includes an array of piezoelectric elements 182 configured to generate electrical power when the plugs 170 are moved between the extended position and the retracted position. Similar to the piezoelectric elements 144 of the door position sensor 122, the piezoelectric elements 182 are embodied as compressible gaskets 184. Each gasket 184 is formed from a piezoelectric ceramic, such as, for example, lead zirconate titanate (PZT). As shown in FIG. 5, each plug 170 includes a rib 186, which is configured to engage and compress each gasket 184 as the plug 170 is moved to the retracted position. When each piezoelectric gasket 184 is compressed, electrical power is generated. It should be appreciated that in other embodiments the piezoelectric element may take other forms, such as, for example, a piezoelectric disk that generates a voltage when deformed. In other embodiments, the piezoelectric element may also be formed from an electroactive polymer (EAP) such as, for example, a stretchable dielectric elastomer.

In the illustrative embodiment, the springs 180 bias the plugs 170 in the extended position. When a sufficient force is applied in the direction indicated by arrows 188 such as, for example, when the mullion bar 62 is positioned in the guide block 80, the bias exerted by the springs 180 is overcome, and the plug 170 is moved from the extended position. The rib 186 is advanced into engagement with gaskets 184, and the gaskets 184 are compressed as the plugs 170 are moved to the retracted position. When the plugs 170 are in the retracted position, the piezoelectric elements 182 generate a predetermined amount of electrical power. In the illustrative embodiment, the predetermined quantity of power is approximately 1 Watt. It should be appreciated that in other embodiments the power may range from approximately 500 μW to 1 Watt. When the mullion bar 62 is withdrawn from the guide block 80, the bias exerted by the springs 180 urge the plug 170 outward to the extended position, thereby permitting the gaskets 184 to expand.

The piezoelectric gaskets 184 of the position sensor 160 is electrically connected to transmitter circuitry 190. The transmitter circuitry 190 is configured to transmit a wireless data signal when energized. In the illustrative embodiment, the transmitter circuitry 190 uses a Bluetooth transmission protocol. The electrical power generated by the gaskets 184 energizes the transmitter circuitry 190 such that the wireless data signal is transmitted. In that way, the position sensor 160 does not require power from the power supply circuit 110 (and hence the AC mains power source 112).

In use, when the mullion bar 62 is positioned in the guide block 80 and engaged with the plugs 170, the transmitter circuitry 190 is energized and generates the wireless data signal. Alternatively, when the door 26 is opened, piezoelectric gaskets 184 are permitted to expand such that the electrical power generated is decreased. As a result, the transmitter circuitry 190 is de-energized such that no wireless data signal is generated.

In other embodiments, the transmitter circuitry 190 may be configured to transmit via a local area network, infrared communication, or other wireless communication protocol. It should also be appreciated that in other embodiments the transmitter circuitry 190 may be replaced with a Radio-Frequency Identification (RFID) tag. When the piezoelectric gaskets 184 are compressed and generating electrical power, the RFID tag may be energized to transmit a wireless signal.

As shown in FIG. 3, the refrigerator 10 includes a wireless receiver 192 that is configured to receive the data signals generated by the position sensors 122, 160. In the illustrative embodiment, the receiver 192 is configured to use the Bluetooth transmission protocol. It should be appreciated that the receiver 192 may be embodied as any type of wireless receiver capable of receiving the data signals from the sensors 122, 160. For example, the wireless receiver may be embodied as a wireless router. The wireless receiver 192 is communicatively coupled to an electronic control unit (ECU) or "electronic controller" 200 via a number of communication links 194 such as wires, cables, or the like.

The electronic controller 200 of the refrigerator 10 is positioned in the cabinet 12. The electronic controller 200 is, in essence, the master computer responsible for interpreting electrical signals sent by sensors associated with the refrigerator 10 and for activating or energizing electronically-controlled components associated with the refrigerator 10. For example, the electronic controller 200 is configured to control operation of the various components of the refrigerator 10, including the lighting devices 118, compressor 120, and the operation of the power circuit 110. The electronic controller 200 also monitors various signals from the control panel 104, the door position sensor 122, the mullion position sensor 160, and any other sensor. The electronic controller 200 also determines when various operations of the refrigerator 10 should be performed. As will be described in more detail below, the electronic controller 200 is operable to control the components of the refrigerator 10 such that the refrigerator 10 solicits user input regarding refrigerator performance and adjusts operational parameters of the refrigerator 10 in response thereto.

To do so, the electronic controller 200 includes a number of electronic components commonly associated with electronic units utilized in the control of electromechanical systems. For example, the electronic controller 200 may include, amongst other components customarily included in such devices, a processor such as a microprocessor 202 and a memory device 204 such as a programmable read-only memory device ("PROM") including erasable PROM's (EPROM's or EEPROM's). The memory device 204 is provided to store, amongst other things, instructions in the form of, for example, a software routine (or routines) which, when executed by the microprocessor 202, allows the electronic controller 200 to control operation of the refrigerator 10.

The electronic controller 200 also includes an analog interface circuit 206. The analog interface circuit 206 converts the output signals from the receiver 192 into signals which are suitable for presentation to an input of the microprocessor 202. In particular, the analog interface circuit 206, by use of an analog-to-digital (A/D) converter (not shown) or the like, converts the analog signals generated by the sensors into digital signals for use by the microprocessor 202. It should be appreciated that the A/D converter may be embodied as a discrete device or number of devices, or may be integrated into the microprocessor 202. It should also be appreciated that if any one or more of the sensors associated with the refrigerator 10 generate a digital output signal, the analog interface circuit 206 may be bypassed.

Similarly, the analog interface circuit 206 converts signals from the microprocessor 202 into output signals which are suitable for presentation to the electrically-controlled components associated with the refrigerator 10 (e.g., the lighting devices 118). In particular, the analog interface circuit 206, by use of a digital-to-analog (D/A) converter (not shown) or the like, converts the digital signals generated by the microprocessor 202 into analog signals for use by the electronically-controlled components associated with the refrigerator 10. It should be appreciated that, similar to the A/D converter described above, the D/A converter may be embodied as a discrete device or number of devices, or may be integrated into the microprocessor 202. It should also be appreciated that if any one or more of the electronically-controlled components associated with the refrigerator 10 operate on a digital input signal, the analog interface circuit 206 may be bypassed.

Thus, the electronic controller 200 may control the operation of the refrigerator 10. In particular, the electronic controller 200 executes a routine including, amongst other things, a control scheme in which the electronic controller 200 monitors the outputs of the sensors associated with the refrigerator 10, including the door position sensor 122 and the mullion position sensor 160, to control the inputs to the electronically-controlled components associated therewith. To do so, the electronic controller 200 communicates with the sensors directly or indirectly through the wireless receiver 192 to determine, amongst numerous other things, the position of the doors 24, 26. Armed with this data, the electronic controller 200 performs numerous calculations, either continuously or intermittently, including looking up values in preprogrammed tables, in order to execute algorithms to perform such functions as activating the lighting devices 118, energizing the compressor 120, activating an indicator on the control panel 104, and so on.

Figure 6:
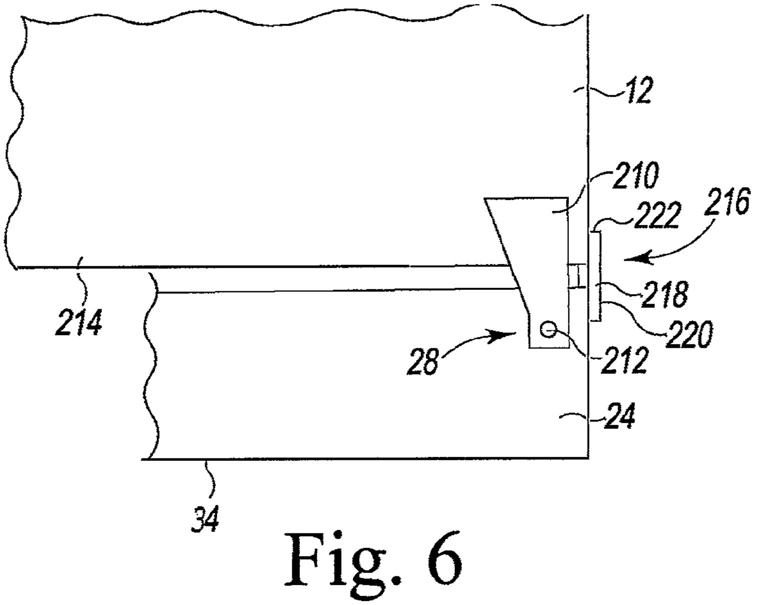
FIG. 6 is a plan view of an upper power generator of the domestic refrigerator of FIG. 1.

As shown in FIG. 6, the refrigerator 10 includes an upper hinge assembly 28 of the refrigerator 10 attached to the upper end 214 of the cabinet 12. The upper hinge assembly 28 includes a hinge bracket 210 and a hinge pin 212 attached to the hinge bracket 210. In the illustrative embodiment, the hinge bracket 210 and the hinge pin 212 are formed as a single monolithic component from a metallic material, such as, for example, steel.

A piezoelectric power generator 216 is secured to the bracket 210. The generator 216 configured to generate electrical power when the door 24 is moved between the closed position and the open position, as described in greater detail below. It should be appreciated that in the illustrative embodiment the door 26 also has one or more piezoelectric power generators (not shown) attached thereto that generates electrical power when the door 26 is opened and closed. In the illustrative embodiment, the generator 216 is embodied as an array of piezoelectric film elements 218. An exemplary film element is the LDT1-028K Piezo Sensor, which is commercially available from Seeed Studio of Shenzhen, China. As show in FIG. 6, each element 218 has a first end 220 secured to the door 24 and a second end 222 secured to the cabinet 12. It should be appreciated that the film elements 218 may be formed from piezoelectric ceramics, such as, for example, lead zirconate titanate (PZT). In other embodiments, the piezoelectric elements may also be formed from an electroactive polymer (EAP) such as, for example, a stretchable dielectric elastomer.

Figure 7:
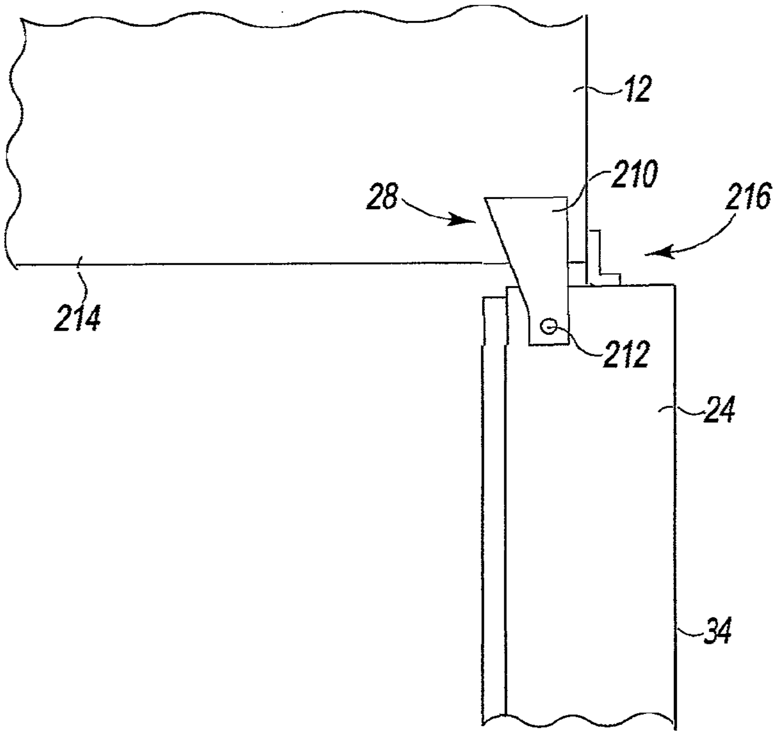
FIG. 7 is a view similar to FIG. 6 showing a door of the domestic refrigerator in an open position.

When the door 24 is opened, the piezoelectric film elements 218 are bent as shown in FIG. 7. As each element 218 is bent, the element 218 generates electrical power proportional to the degree of bending. The electrical power generated by the each element 218 therefore increases as the door 24 is moved to the open position. When the door 24 is in the open position, the electrical power exceeds a predetermined quantity of power. In the illustrative embodiment, the predetermined quantity of power is approximately 1 Watt. It should be appreciated that in other embodiments the power may range from approximately 500 μW to 1 Watt.

As shown in FIG. 3, the generator 216 is electrically connected to the power supply circuit 110. When electrical power is produced by the generator 216, the controller 200 is configured to operate the power supply circuit 110 to direct the power to one of the other electrical components 116 of the refrigerator 10. For example, the power produced by the generator 216 may be directed through the power supply circuit 110 to the lighting devices 118. The controller 200 may also operate the power supply circuit 110 to direct the electrical power to a battery 230 for storage and later use.

Figure 8:
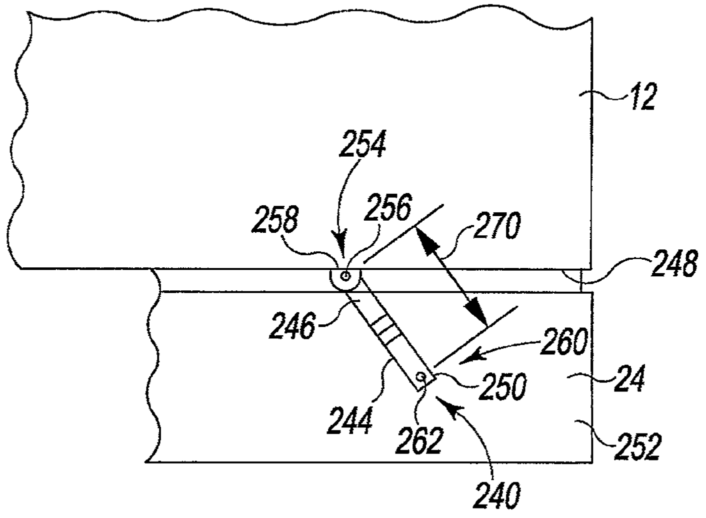
FIG. 8 is a plan view of a lower power generator of the domestic refrigerator of FIG. 1 with the door in a closed position.
Figure 9:
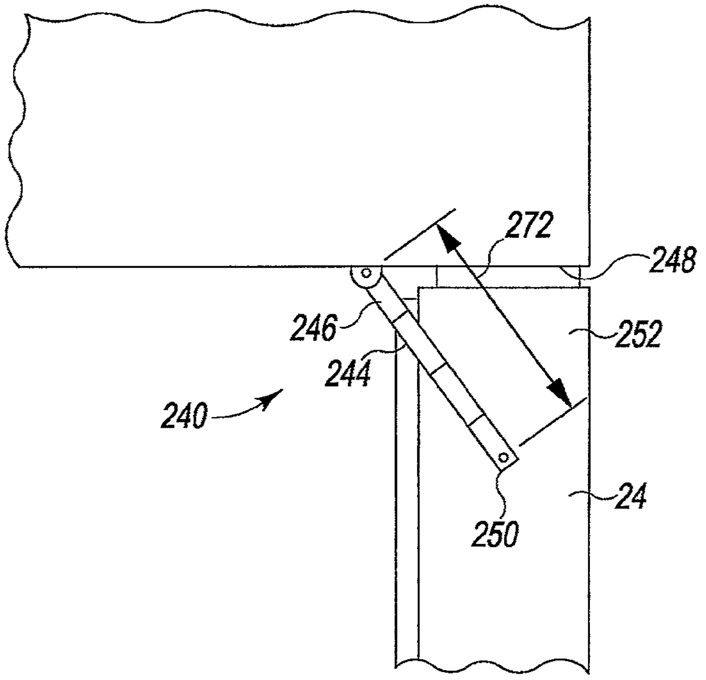
FIG. 9 is a view similar to FIG. 8 showing the door in an open position.

As shown in FIGS. 8 and 9, the refrigerator 10 includes another piezoelectric power generator 240. The generator 240 is configured to generate electrical power when the door 24 is moved between the closed position and the open position, as described in greater detail below. In the illustrative embodiment, the generator 240 is formed from an electroactive polymer (EAP) such as, for example, a stretchable dielectric elastomer, which generates electrical power when deformed. In other embodiments, the generator 240 may be formed as a spring or disk from a piezoelectric ceramic, such as, for example, lead zirconate titanate (PZT).

The generator 240 has a body 244 that is positioned below the door 24. The body 244 has an end 246 that is secured to the lower front surface 248 of the cabinet 12 and another end 250 secured to the lower end 252 of the door 24. As shown in FIGS. 8 and 9, the end 246 of the body 244 is attached to the surface 248 via a joint 254. In the illustrative embodiment, the joint 254 includes a pin 256 that extends through the body 244 and a bracket 258 secured to the cabinet surface 248. The joint 254 permits the body 244 of the generator 240 to pivot relative to the cabinet 12.

The opposite end 250 of the body 244 is attached to the surface 248 via a joint 260. In the illustrative embodiment, the joint 260 includes a pin 262 that extends through the body 244 and a hole (not shown) defined in the lower end 252 of the door 24. The joint 260 permits the body 244 of the generator 240 to pivot relative to the door 24.

When the door 24 is opened, the body 244 of the generator 240 is stretched and deformed. As shown in FIG. 8, the body 244 has an initial length 270 when the door 24 is closed. As the door 24 is opened, the body 244 stretches to a length 272, as shown in FIG. 9. As the body 244 is stretched, the body 244 generates electrical power proportional to the amount of deformation. The electrical power generated by the body 244 therefore increases as the door 24 is moved to the open position. When the door 24 is in the open position, the electrical power exceeds a predetermined quantity of power. In the illustrative embodiment, the predetermined quantity of power is approximately 1 Watt. It should be appreciated that in other embodiments the power may range from approximately 500 μW to 1 Watt.

As shown in FIG. 3, the generator 240 is electrically connected to the power supply circuit 110. When electrical power is produced by the generator 240, the controller 200 is configured to operate the power supply circuit 110 to direct the power to one of the other electrical components 116 of the refrigerator 10. For example, the power produced by the generator 240 may be directed through the power supply circuit 110 to the lighting devices 118. The controller 200 may also operate the power supply circuit 110 to direct the electrical power to the battery 230 for storage and later use.

In use, a user may open the doors 24, 26 to access food items positioned in the refrigerated compartment 16. To do so, the user may grasp the handle 32 and pull the door 26 open. As the door 26 is opened, the bias exerted by the spring 142 of the door position sensor 122 urges the plug 132 outward to the extended position. As the spring 142 is expanded, the electrical power generated by the piezoelectric gaskets 146 is reduced, and the transmitter circuitry 156 of the position sensor 122 is de-energized such that no wireless data signal is generated.

As described above, the electrical power generators 216, 240 are operable to produce electrical power when the door 24 is opened. As the door 24 is opened, the film elements 218 of the generator 216 bend and generate electrical power proportional to the degree of bending. Similarly, the body 244 of the generator 240 stretches as the door 24 opens and generates electrical power proportional to the amount of deformation.

The controller 200 detects the loss of signal from the sensor 122 and generates an electrical output signal to operate the power supply circuit 110. In response to the receiving the signal from the controller 200, the circuit 110 supplies power to, for example, the lighting devices 118 to illuminate the compartment 16. The power supply circuit 110 may direct the electrical power supplied by the generators 216, 240 to energize the lighting devices 118 or to the battery 230 for storage. Additionally, or alternatively, the power supply circuit 110 may supply power from the ac mains power source 112 to energize the lighting device 118.

When the doors 24, 26 are closed, the power generated by the electrical power generators 216, 240 decreases to approximately zero. The piezoelectric gaskets 146 of the door position sensor 122 are compressed by the rib 150 as the plug 132 is moved from the extended position such that the gaskets 146 generate electrical power. When the door 26 is closed, the transmitter circuitry 156 of the door position sensor 122 is energized and generates the wireless data signal. The controller 200 detects the signal from the sensor 122 and generates an electrical output signal to operate the power supply circuit 110 to, for example, deenergize the lighting devices 118.

As the door 26 is closed, the mullion bar 62 is advanced into the guide block 80, and the position sensor 160 generates an output signal. As described above, the piezoelectric gaskets 184 of the sensor 160 are compressed by the rib 186 as mullion bar 62 engages the plugs 170. When the mullion bar 62 is seated in the guide block 80, the electrical power generated by the piezoelectric gaskets 184 energizes the transmitter circuitry 190 such that the wireless data signal is transmitted. The controller 200 detects the signal from the sensor 160 and may use the signal to, for example, operate the power supply circuit 110.

If the door 26 is not closed properly, the mullion bar 62 may not be fully positioned in the guide block 80 when the door 26 is closed. In such a case, no wireless signal is generated by the transmitter circuitry 190. After the controller 200 receives the wireless signal from the door position sensor 122, the controller may wait a predetermined amount of time to receive the wireless signal from the mullion position sensor 160. If no signal is received, the controller 200 may generate an electrical output signal to activate an icon on the control panel 104 or energize the lighting devices 118 to indicate to the user that the mullion bar 62 is not properly positioned.

Figure 10:
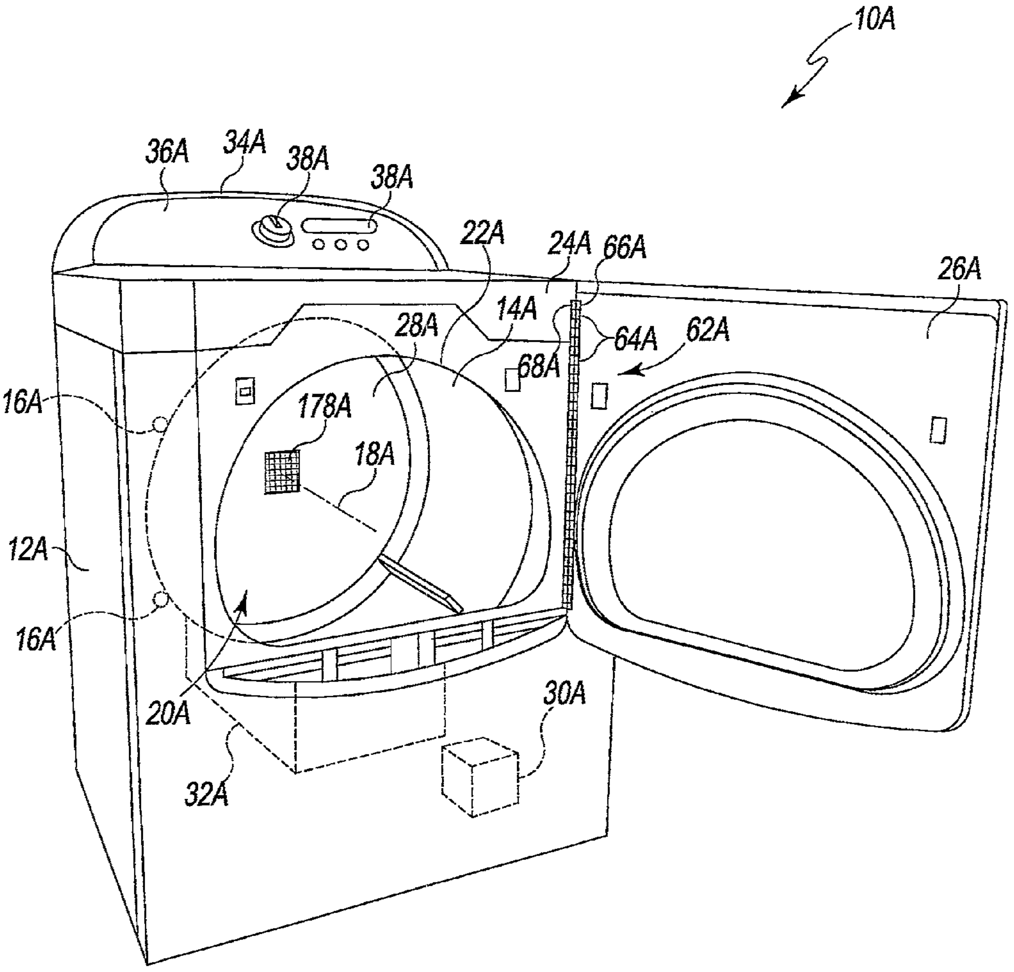
FIG. 10 is a front perspective view of a dryer appliance.

Referring to FIG. 10, a home appliance is shown as a dryer appliance 10A (hereinafter dryer 10A) for drying or tumbling laundry. The dryer 10A includes a cabinet 12A and a drum 14A positioned in the cabinet 12A. The drum 14A is supported by a plurality of roller bearings 16A, which permit the drum 14A to rotate about a longitudinal axis 18A relative to the cabinet 12A. A chamber 20A is defined in the drum 14A and is sized to receive laundry. In use, laundry placed in the chamber 20A is tumbled when the drum 14A is rotated about the axis 18A.

The cabinet 12A has an access opening 22A defined in a front panel 24A, and the access opening 22A is sized to permit user access to the drum chamber 20A. A door 26A is hinged to the front panel 24A and is sized to cover the access opening 22A. The door 26A is moveable between the open position shown in FIG. 10 in which user access to the opening 22A is permitted and a closed position in which user access to the opening 22A is prevented. It should be appreciated that in other embodiments the door 26A may be a tiltable door rather than the swinging door shown in FIG. 10. The cabinet 12A also includes a rear bulkhead 28A that encloses the rear end of the chamber 20A. Additionally, in other embodiments, the door 26A may include a window that permits the user to see the chamber 20A when the door 26A is closed.

The dryer 10A also includes a drive mechanism 30A that is operable to rotate the drum 14A about the axis 18A, and an air system 32A that is configured to advance heated air through the chamber 20A of the drum 14A to dry wet laundry contained in the drum 14A. As shown in FIG. 10, the cabinet 12A includes an upper console 34A, and a control panel 36A is attached to the console 34A. The control panel 36A includes a plurality of controls 38A such as, for example, buttons, switches, knobs, or screens, which may be used to operate the various components of the dryer 10A, including the drive mechanism 30A and the air system 32A, as described in greater detail below.

Figure 11:
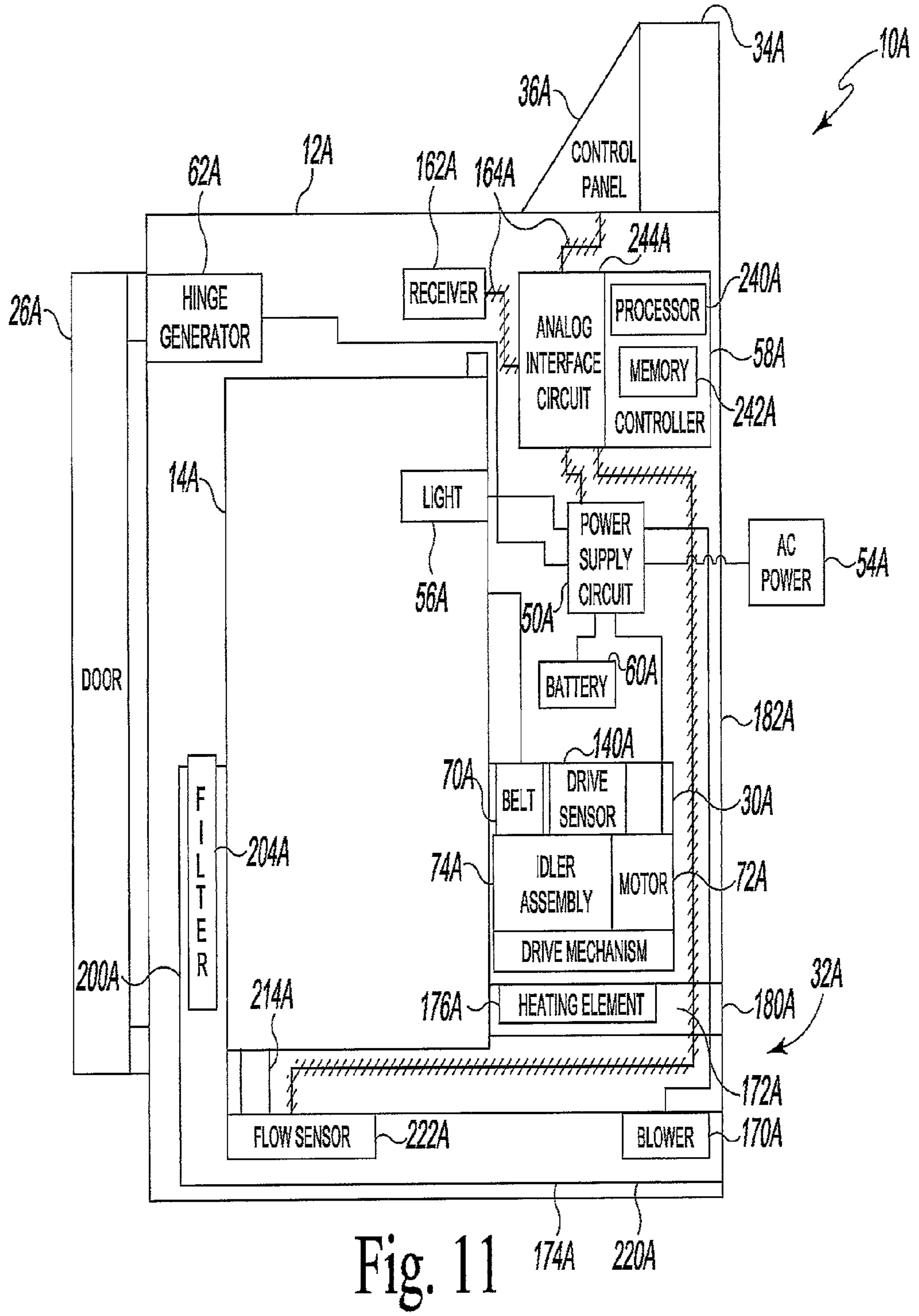
FIG. 11 is a simplified block diagram of the dryer appliance of FIG. 10.

Referring now to FIG. 11, a number of the components of the dryer 10A are shown in a simplified block diagram. The dryer 10A includes a power supply circuit 50A that is configured to supply electrical power to the electrical components of the dryer 10A. The components of the power supply circuit 50A may be located in any suitable portion of the dryer 10A. It should be appreciated that the power supply circuit 50A may include components, sub-components, and devices other than those shown in FIG. 11, which are not illustrated for clarity of the description.

As shown in FIG. 11, the power supply circuit 50A may be electrically coupled to an AC mains power source 54A, such as, for example, an electrical outlet commonly found in residential homes. The AC mains power source 54A is electrically coupled to a DC power converter of the power supply circuit 50A via a number of signal paths. These signal paths and other signal paths illustrated in FIG. 11 may be embodied as any type of signal paths capable of communicating electrical signals between the components of the power supply circuit 50A. For example, the signal paths may be embodied as any number of wires, cables, printed circuit board traces, bus, intervening devices, and/or the like.

The power supply circuit 50A is electrically coupled to a number of the electrical components of the dryer 10A. In the illustrative embodiment, the electrical components include a lighting device 56A for illuminating the interior of the drum 14A and an electronic control unit (ECU) or "electronic controller" 58A, which is configured to control the operation of the dryer 10A. The electrical components also include a battery 60A and a number of components of the drive mechanism 30A and the air system 32A, as described in greater detail below.

The dryer 10A also includes a piezoelectric power generator 62A that is configured to generate electrical power when the door 26A is moved between the closed position and the open position. In the illustrative embodiment, the generator 62A is embodied as an array of piezoelectric film elements 64A, as shown in FIG. 10. An exemplary film element is the LDT1-028K Piezo Sensor, which is commercially available from Seeed Studio of Shenzhen, China. Each element 64A has a first end 66A secured to the door 26A and a second end 68A secured to the front panel 24A of the cabinet 12A. It should be appreciated that the film elements 64A may be formed from piezoelectric ceramics, such as, for example, lead zirconate titanate (PZT). In other embodiments, the piezoelectric elements may also be formed from an electroactive polymer (EAP) such as, for example, a stretchable dielectric elastomer.

When the door 26A is opened, the piezoelectric film elements 64A are bent as shown in FIG. 10. As the elements 64A bend, the elements 64A generate electrical power proportional to the degree of bending. The electrical power generated by the each element 64A therefore increases as the door 26A is moved to the open position. When the door 26A is in the open position, the electrical power exceeds a predetermined quantity of power. In the illustrative embodiment, the predetermined quantity of power is approximately 1 Watt. It should be appreciated that in other embodiments the power may range from approximately 500 μW to 1 Watt. The elements 64A of the generator 62A are electrically connected to the power supply circuit 50A such that power generated by the elements 64A may be distributed to the other electrical components of the dryer 10A, as described in greater detail below.

Figure 12:
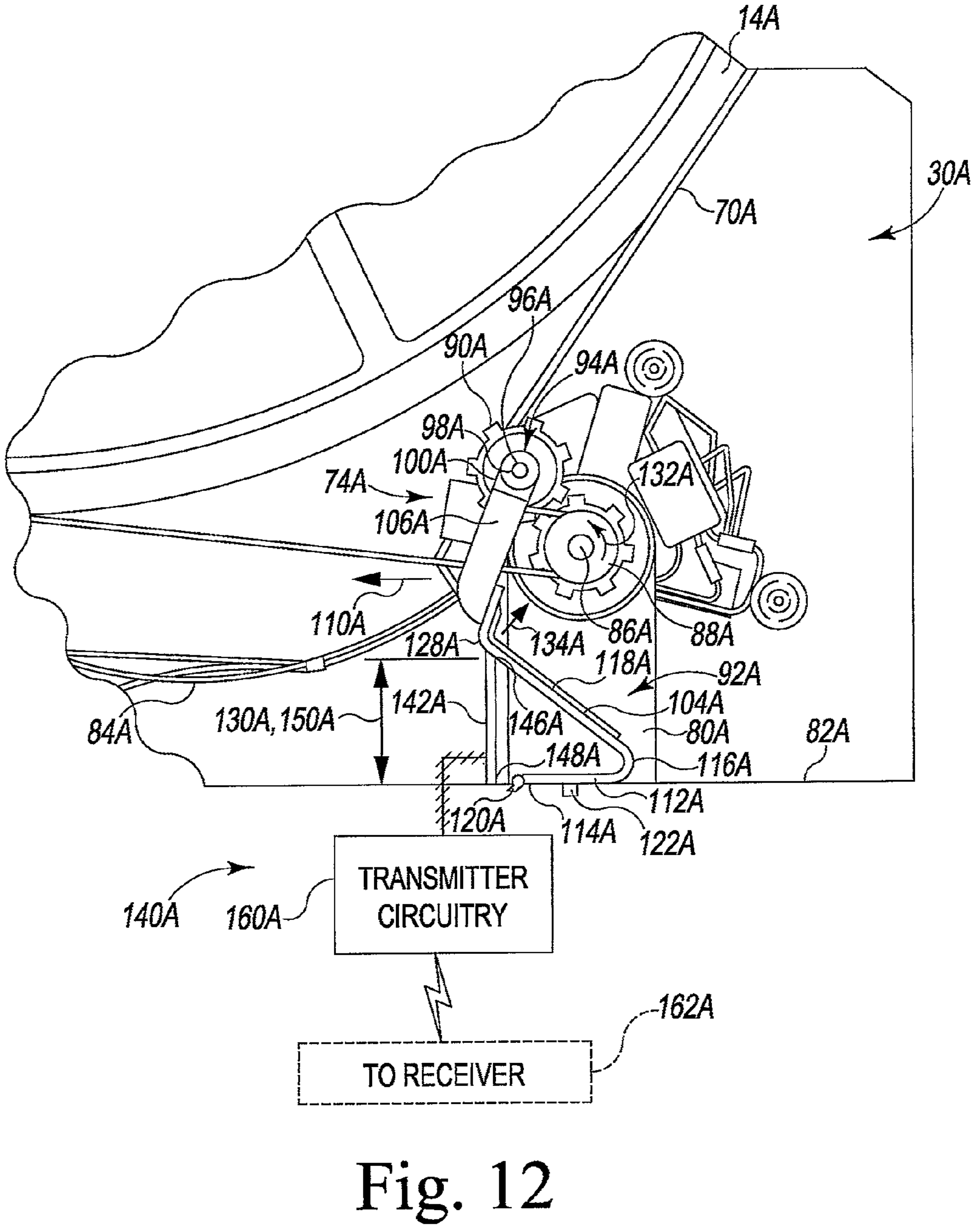
FIG. 12 is a partial elevation view of the drive mechanism of the dryer appliance of FIG. 10.

Referring to FIGS. 11-12, the drive mechanism 30A of the dryer 10A includes a belt 70A that engages the drum 14A, an electric motor 72A that is configured to drive the belt 70A to rotate the drum 14A about the axis 18A, and an idler assembly 74A configured to tension the belt 70A. As shown in FIG. 12, the motor 72A is coupled to a motor support bracket 80A that is attached to a base frame 82A of the dryer 10A. A plurality of wires 84A connect the motor 72A to the power supply circuit 50A and permit electrical power to be supplied to the motor 72A during operation. The motor 72A has a drive shaft 86A that supports a drive pulley 88A such that when the motor 72A is energized the drive pulley 88A is rotated. It should be appreciated that the drive pulley 88A may be integrally formed with the drive shaft 86A or may be a separate component that is assembled with the drive shaft 86A.

The drive pulley 88A and the drum 14A are connected via the belt 70A, which wraps around the drive pulley 88A and the drum 14A. The belt 70A also engages an idler pulley 90A of the idler assembly 74A, which presses against and thereby tensions the belt 70A, as described in greater detail below. The idler assembly 74A includes a support bracket 92A that supports the idler pulley 90A. In the illustrative embodiment, the idler pulley 90A is coupled to the support bracket 92A via a joint 94A. As shown in FIG. 12, the joint 94A includes a cylindrical pin 96A that is received in bores 98A defined in the idler pulley 90A and an upper end 100A of the support bracket 92A. In that way, the joint 94A permits the idler pulley 90A to rotate.

The lower end of the support bracket 92A is secured to the base frame 82A of the dryer 10A. As shown in FIG. 12, the bracket 92A includes a spring support 104A extending from the lower end and an upper support 106A extending from the spring support 104A to the upper end 100A. The spring support 104A is configured to exert a biasing force in the direction indicated by arrow 110A to bias the idler pulley 90A into engagement with the belt 70A.

The spring support 104A of the idler assembly 74A includes a base 112A extending from a free end 114A to an end 116A attached to a lever 118A. A mounting tab 120A and a peg 122A extend from the base 112A between the ends 114A, 116A. The tab 120A and the peg 122A are received in slots defined in the base frame 82A of the dryer 10A to secure the support 104A to the base frame 82A. As shown in FIG. 12, the lever 118A extends upwardly from the base 112A to an upper end 128A that is secured to the upper support 106A.

The lever 118A cooperates with the base 112A to define a substantially V-shape of the spring support 104A. A distance 130A is defined between the upper end 128A of the lever 118A and the base frame 82A. The spring support 104A is designed to have a thickness and bending resistance to resist an expansion of its V-shape (and hence an increase in the distance 130A) during operation of the dryer 10A. In that way, the support 104A provides the biasing force in the direction indicated by arrow 110A to bias the idler pulley 90A into engagement with the belt 70A.

In the illustrative embodiment, the support 104A is formed from a metallic material such as, for example, stainless steel. It should be appreciated that in other embodiments the support 104A may be formed from a polymer material. Additionally, in other embodiments, the idler assembly 74A may include a helical spring, compression spring, or other type of biasing element to bias the idler pulley 90A into engagement with the belt 70A.

When the motor 72A is energized, the drive shaft 86A and the drive pulley 88A are rotated in the direction indicated by curved arrow 132A in FIG. 12. As the drive pulley 88A is rotated, the belt 70A is advanced along the drive pulley 88A, the idler pulley 90A, and the drum 14A, thereby causing the idler pulley 90A and the drum 14A to rotate. The tension on the belt 70A changes as the drum 14A is rotated, and that change in the tension, along with circular run out of the outer diameter of the drum 14A, exerts a force on the idler pulley 90A in the direction opposite the arrow 110A. During operation, the force on the idler pulley 90A is continuously varied as the drum 14A is rotated. When the force on the idler pulley 90A exceeds the biasing force of the support 104A, the lever 118A is moved in the direction indicated by arrow 134A, thereby causing the distance 130A between the upper end 128A of the lever 118A and the base 112A to increase. Because the amount of force on the idler pulley 90A is continuously varied as the drum 14A is rotated, the distance 130A defined between the upper end 128A of the lever 118A and the base 112A is also continuously varied.

As shown in FIGS. 11-12, the dryer 10A includes a drive sensor 140A to provide an indication of the status of the drive mechanism 30A. The sensor 140A includes a piezoelectric power generator 142A that is configured to generate electrical power when the drum 14A is rotated. In the illustrative embodiment, the generator 142A is formed from an electroactive polymer (EAP) such as, for example, a stretchable dielectric elastomer, which generates electrical power when deformed. In other embodiments, the generator 142A may be formed as a spring or disk from a piezoelectric ceramic, such as, for example, lead zirconate titanate (PZT).

As shown in FIG. 12, the generator 142A has an upper end 146A secured to the upper end 128A of the lever 118A and a lower end 148A secured to the base frame 82A. The generator 142A has an initial length 150A, which is equal to the distance 130A, when the dryer 10A is not operated. When the lever 118A is moved in the direction indicated by arrow 134A by the rotation of the drum 14A, the generator 142A is stretched to an increased length that is approximately 0.125 inches greater than the initial length 150A. In other embodiments, the generator 142A may deform by a greater or lesser amount. As the generator 142A is stretched, the generator 142A generates electrical power proportional to the amount of deformation. The continuous movement of the lever 118A thereby causes the generator 142A to move back and forth between its initial length and its stretched length. In the illustrative embodiment, the generator 142A is configured to generate an average quantity of power equal to approximately 1 Watt. It should be appreciated that in other embodiments the power may range from approximately 500 μW to 1 Watt.

The piezoelectric generator 142A is electrically connected to transmitter circuitry 160A. The transmitter circuitry 160A is configured to transmit a wireless data signal when energized. In the illustrative embodiment, the transmitter circuitry 160A uses a Bluetooth transmission protocol. The electrical power generated by the generator 142A energizes the transmitter circuitry 160A such that the wireless data signal is transmitted. In that way, the drive sensor 140A does not require power from the power supply circuit 50A (and hence the AC mains power source 54A).

When the dryer 10A is in operation, the transmitter circuitry 160A is energized by the generator 142A and generates the wireless data signal. If, for example, the belt 70A is broken or if the drive mechanism 30A has another fault that permits the motor 72A from rotating, the lever 118A would not move and no power would be generated by the generator 142A. As a result, the transmitter circuitry 160A would be de-energized. In that way, the sensor 140A provides an indication of the status of the drive mechanism 30A.

In other embodiments, the transmitter circuitry 160A may be configured to transmit via a local area network, infrared communication, or other wireless communication protocol. It should also be appreciated that in other embodiments the transmitter circuitry 160A may be replaced with a Radio-Frequency Identification (RFID) tag. When the generator 142A is generating electrical power, the RFID tag may be energized to transmit a wireless signal.

As shown in FIG. 11, the dryer 10A includes a wireless receiver 162A that is configured to receive the data signals generated by the drive sensor 140A. In the illustrative embodiment, the receiver 162A is configured to use the Bluetooth transmission protocol. It should be appreciated that the receiver 162A may be embodied as any type of wireless receiver capable of receiving the data signals from the sensor 140A. For example, the wireless receiver may be embodied as a wireless router. The wireless receiver 162A is communicatively coupled the electronic controller 58A via a number of communication links 164A such as wires, cables, or the like.

As described above, the dryer 10A also includes an air system 32A that is configured to advance heated air through the chamber 20A of the drum 14A to dry the wet laundry as it is tumbled by drum 14A. In the illustrative embodiment, the air system 32A is a negative pressure or vacuum system by which a motor driven blower 170A draws air into a heating duct 172A, through the chamber 20A, and into an exit duct 174A before the air is discharged from the dryer 10A. The air system 32A also includes an electric heating element 176A that is positioned in the duct 172A and is configured to heat the air passing through the duct 172A. The blower 170A and the heating element 176A are electrically coupled to the power supply circuit 50A, which supplies power to the blower 170A and the element 176A during operation. It should be appreciated that in other embodiments the dryer 10A may include a gas-fired burner or heater to heat the air in the duct 172A.

The heating duct 172A of the system 32A includes an inlet opening 180A defined in a rear panel 182A of the cabinet 12A and an outlet grill or opening 178A that is defined in the bulkhead 28A (see FIG. 10). Air heated by the heating element 176A may advance through the grill 178A into the chamber 20A of the drum 14A.

Figure 13:
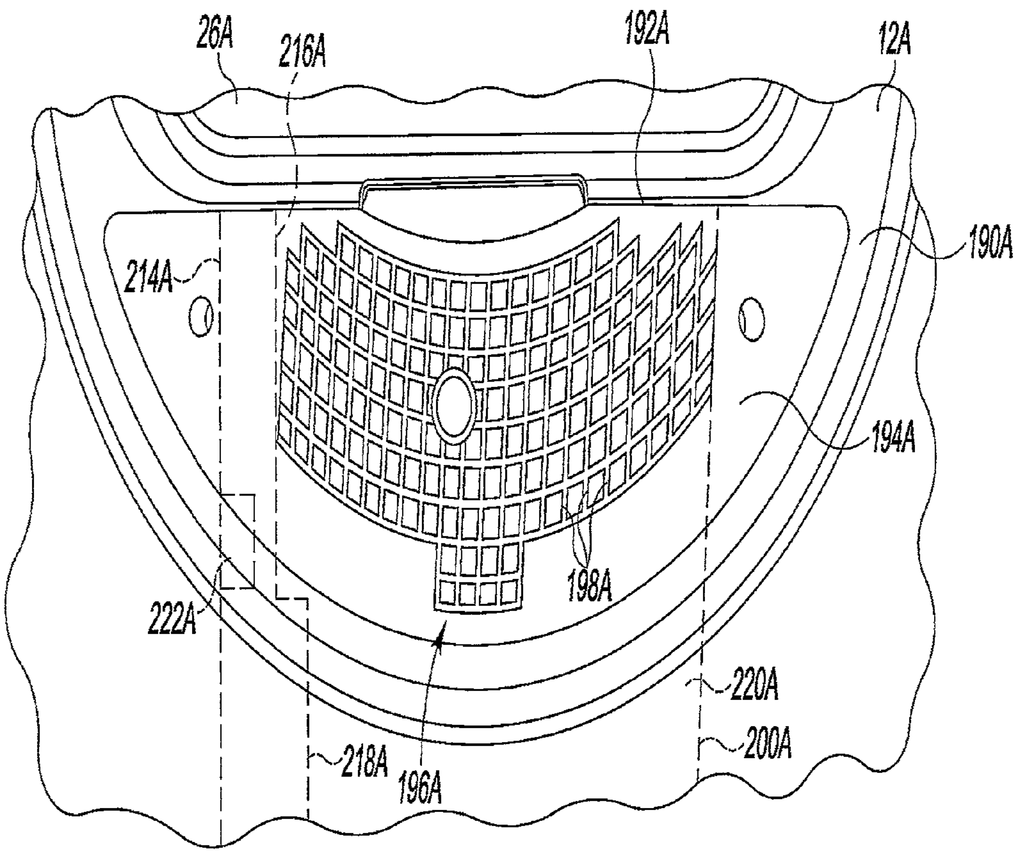
FIG. 13 is a partial elevation view of the interior of the dryer appliance of FIG. 10.
Figure 14:
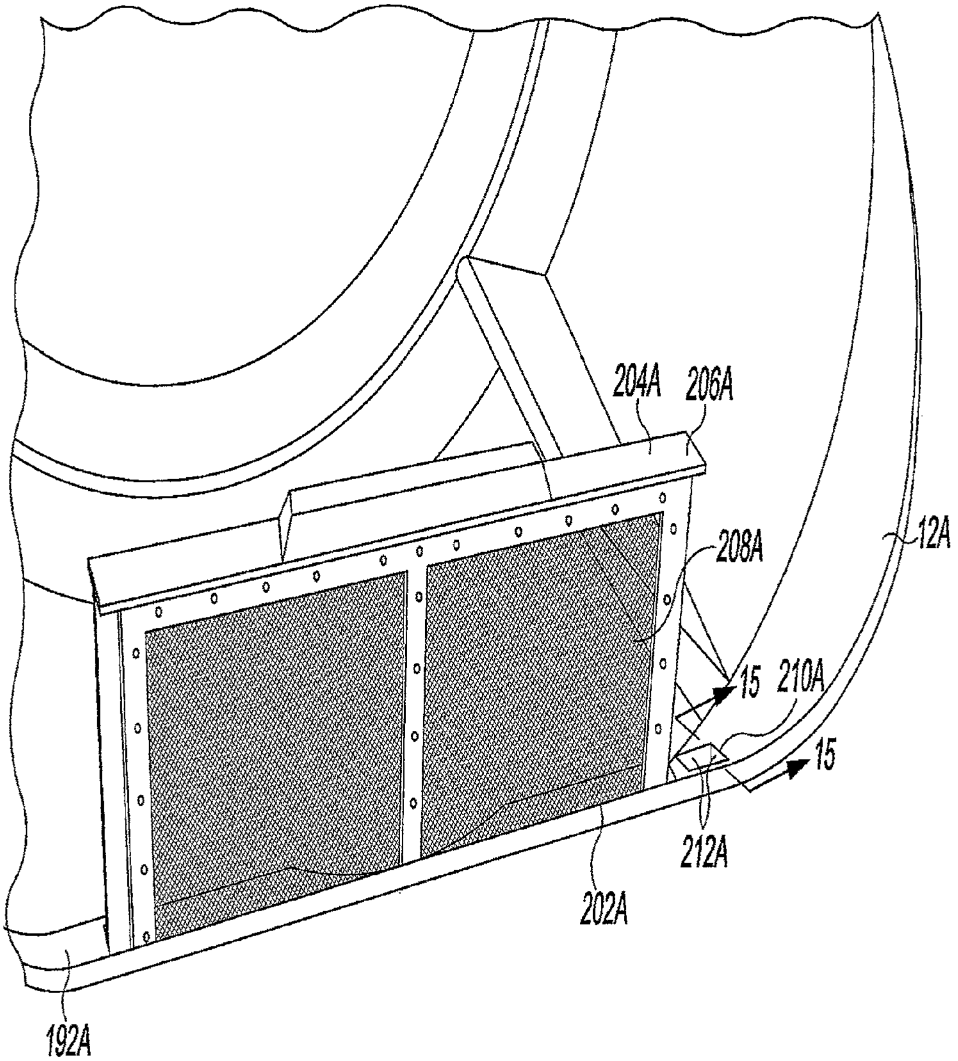
FIG. 14 is a perspective view of a filter screen of the dryer appliance of FIG. 1.

As shown in FIGS. 13-14, the cabinet 12A includes a forward bulkhead 190A that is positioned below the access opening 22A. The forward bulkhead 190A includes an upper surface 192A and an inner side wall 194A that extends downwardly from the upper surface 192A. An exit grill 196A is defined in the inner side wall 194A. As shown in FIG. 13, the exit grill 196A includes a plurality of openings 198A that connect the chamber 20A of the drum 14A with a chute 200A of the exit duct 174A.

The upper surface 192A of the forward bulkhead 190A has a slot 202A defined therein. The slot 202A is rectangular and opens into the chute 200A. The chute 200A and the slot 202A are sized to receive a filter 204A. The filter 204A includes a handle 206A configured to be positioned in the slot 202A and a screen 208A, which is positioned over the openings 198A of the exit grill 196A when the handle 206A is positioned in the slot 202A. Air advanced through the openings 198A is passed through the screen 208A, which is configured to trap or catch lint and other particulates carried by the air to prevent their passage into the remainder of the exit duct 174A and hence the blower 170A. As shown in FIGS. 13 and 14, the filter 204A may be removed from the chute 200A and the slot 202A for cleaning.

As shown in FIG. 14, another opening 210A is defined in the upper surface 192A of the forward bulkhead 190A adjacent to the slot 202A. A number of inner walls 212A extend downwardly from the opening 210A to define a passageway 214A of the exit duct 174A. As shown in FIG. 13, the upper end 216A of the passageway 214A is isolated from the chute 200A by the inner walls 212A. The lower end 218A of the passageway 214A merges with the chute 200A to form a main passageway 220A of the exit duct 174A. The passageway 214A is sized such that a fraction of the air circulating in the chamber 20A of the drum 14A advances through the passageway 214A. The remaining air is advanced through the openings 198A of the exit grill 196A and into the screen 208A of the filter 204A during normal operation. In the illustrative embodiment, a flow sensor 222A is positioned in upper end 216A of the passageway 214A.

Figure 15:
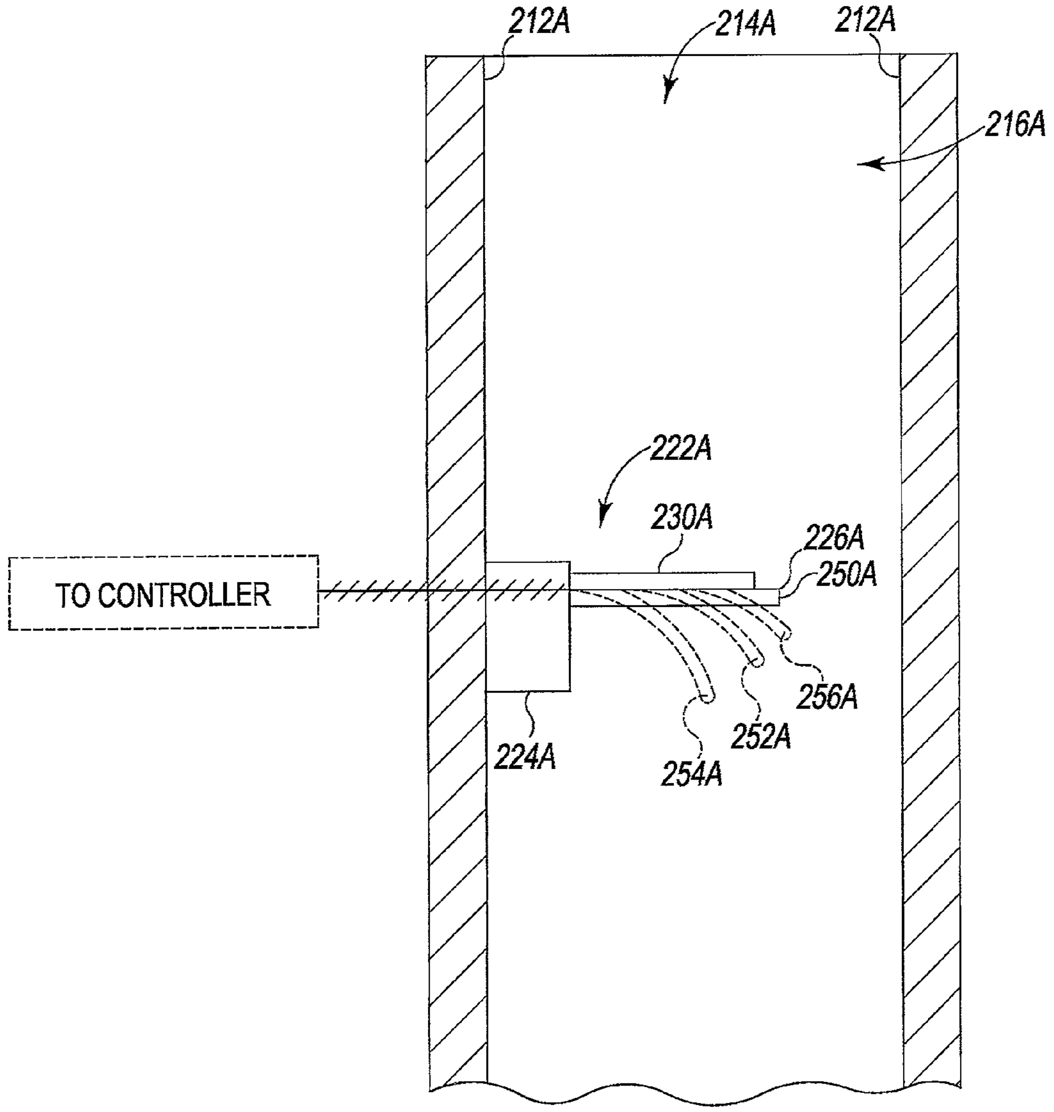
FIG. 15 is a cross-sectional elevation view taken along the line 6-6 of FIG. 14.

As shown in FIG. 15, the flow sensor 222A includes a base 224A secured to one of the inner walls 212A defining the passageway 214A and a cantilevered arm 226A extending outwardly from the base 224A. The flow sensor 222A also includes a piezoelectric power generator 230A, which extends over the cantilevered arm 226A and is configured to generate power when air is advanced through the passageway 214A. In the illustrative embodiment, the generator 230A is embodied as a piezoelectric film element. An exemplary film element is the LDT1-028K Piezo Sensor, which is commercially available from Seeed Studio of Shenzhen, China. It should be appreciated that the film element may be formed from a piezoelectric ceramic, such as, for example, lead zirconate titanate (PZT). In other embodiments, the piezoelectric element may also be formed from an electroactive polymer (EAP) such as, for example, a stretchable dielectric elastomer.

When air is advanced through the passageway 214A, the force of the air flow causes the cantilevered arm 226A to deflect. The amount of deflection is proportional to the force of the air flow. When the cantilevered arm 226A is deflected, the generator 230A is bent, thereby causing the generator 230A to generate power. As described above, a piezoelectric film generator 230A generates electrical power proportional to the degree of bending; as such, the amount of electrical power generated by the generator 230A is proportional to the amount of deflection of the arm 226A and hence the force of the air flowing through the passageway 214A. The piezoelectric generator 230A is electrically connected to electronic controller 58A, which may adjust the operation of the dryer 10A based on the amount of electrical power generated by the generator 230A, as described in greater detail below. It should be appreciated that in other embodiments the generator 230A may be connected to the controller 58A via wireless circuitry.

The electronic controller 58A of the dryer 10A is positioned in the cabinet 12A. The electronic controller 58A is, in essence, the master computer responsible for interpreting electrical signals sent by sensors associated with the dryer 10A and for activating or energizing electronically-controlled components associated with the dryer 10A. For example, the electronic controller 58A is configured to control operation of the various components of the dryer 10A, including the lighting device 56A, heating element 176A, blower 170A, motor 72A, and the operation of the power circuit 50A. The electronic controller 58A also monitors various signals from the control panel 36A, the drive sensor 140A, the flow sensor 222A, and any other sensor. The electronic controller 58A also determines when various operations of the dryer 10A should be performed. As will be described in more detail below, the electronic controller 58A is operable to control the components of the dryer 10A such that the dryer 10A solicits user input regarding dryer performance and adjusts operational parameters of the dryer 10A in response thereto.

To do so, the electronic controller 58A includes a number of electronic components commonly associated with electronic units utilized in the control of electromechanical systems. For example, the electronic controller 58A may include, amongst other components customarily included in such devices, a processor such as a microprocessor 240A and a memory device 242A such as a programmable read-only memory device ("PROM") including erasable PROM's (EPROM's or EEPROM's). The memory device 242A is provided to store, amongst other things, instructions in the form of, for example, a software routine (or routines) which, when executed by the microprocessor 240A, allows the electronic controller 58A to control operation of the dryer 10A.

The electronic controller 58A also includes an analog interface circuit 244A. The analog interface circuit 244A converts the output signals from the receiver 162A into signals which are suitable for presentation to an input of the microprocessor 240A. In particular, the analog interface circuit 244A, by use of an analog-to-digital (A/D) converter (not shown) or the like, converts the analog signals generated by the sensors into digital signals for use by the microprocessor 240A. It should be appreciated that the A/D converter may be embodied as a discrete device or number of devices, or may be integrated into the microprocessor 240A. It should also be appreciated that if any one or more of the sensors associated with the dryer 10A generate a digital output signal, the analog interface circuit 244A may be bypassed.

Similarly, the analog interface circuit 244A converts signals from the microprocessor 240A into output signals which are suitable for presentation to the electrically-controlled components associated with the dryer 10A (e.g., the lighting device 56A). In particular, the analog interface circuit 244A, by use of a digital-to-analog (D/A) converter (not shown) or the like, converts the digital signals generated by the microprocessor 240A into analog signals for use by the electronically-controlled components associated with the dryer 10A. It should be appreciated that, similar to the A/D converter described above, the D/A converter may be embodied as a discrete device or number of devices, or may be integrated into the microprocessor 240A. It should also be appreciated that if any one or more of the electronically-controlled components associated with the dryer 10A operate on a digital input signal, the analog interface circuit 244A may be bypassed.

Thus, the electronic controller 58A may control the operation of the dryer 10A. In particular, the electronic controller 58A executes a routine including, amongst other things, a control scheme in which the electronic controller 58A monitors the outputs of the sensors associated with the dryer 10A, including the drive sensor 140A and the flow sensor 222A, to control the inputs to the electronically-controlled components associated therewith. To do so, the electronic controller 58A communicates with the sensors directly or indirectly through the wireless receiver 162A to determine, amongst numerous other things, the state of the drive mechanism 30A and the air system 32A. Armed with this data, the electronic controller 58A performs numerous calculations, either continuously or intermittently, including looking up values in preprogrammed tables, in order to execute algorithms to perform such functions as energizing the electric motor 72A, energizing the heating element 176A, energizing the blower 170A, activating an indicator on the control panel 36A, and so on.

In use, a user may open the door 26A to place wet laundry in the drum chamber 20A or remove dry laundry therefrom. As described above, the power generator 62A is operable to generate electrical power when the door 26A is opened. As the door 26A is opened, the film elements 64A of the generator 62A bend and generate electrical power proportional to the degree of bending. As described above, the electrical power generated by the generator 62A is transferred to the power supply circuit 50A. The controller 58A may detect the power generation via the power supply circuit 50A and determine that the door 26A is open. In other embodiments, the dryer 10A may also include a door position sensor that generates a signal when the door 26A is opened.

When the controller 58A determines the door 26A is opened, the controller 58A may generate an electrical output signal to operate the power supply circuit 50A. In response to the receiving the signal from the controller 58A, the circuit 50A supplies power to, for example, the lighting device 56A to illuminate the chamber 20A. The power supply circuit 50A may direct the electrical power supplied by the generator 62A to energize the lighting device 56A or to the battery 60A for storage. Additionally, or alternatively, the power supply circuit 50A may supply power from the ac mains power source 54A to energize the lighting device 56A.

When the door 26A is closed, the power generated by the electrical power generator 62A decreases to approximately zero. The controller 58A may detect this loss of power and generate an electrical output signal to operate the power supply circuit 50A to, for example, deenergize the lighting device 56A.

The user may utilize the control panel 36A to select a laundry cycle and activate the dryer 10A. In response to a user input from the control panel 36A, the controller 58A may operate the various electrical components of the dryer 10A to execute the cycle. The controller 58A may operate the power supply circuit 50A to energize the motor 72A, the blower 170A, and the heating element 176A. As described above, when the motor 72A is energized, the drive shaft 86A and the drive pulley 88A are rotated in the direction indicated by curved arrow 132A. As the drive pulley 88A is rotated, the belt 70A is advanced along the drive pulley 88A, the idler pulley 90A, and the drum 14A, thereby causing the idler pulley 90A and the drum 14A to rotate.

As described above, the tension on the belt 70A changes as the drum 14A is rotated, and that change in the tension, along with circular run out of the outer diameter of the drum 14A, exerts a force on the idler pulley 90A. When the force on the idler pulley 90A exceeds the biasing force of the support 104A, the lever 118A is moved in the direction indicated by arrow 134A in FIG. 12, thereby causing the distance 130A between the upper end 128A of the lever 118A and the base 112A to increase. As described above, the movement of the lever 118A causes the generator 142A of the sensor 140A to stretch and generate electrical power in proportion thereto. The continuous movement of the lever 118A thereby causes the generator 142A to move back and forth between its initial length and its stretched length such that an average amount of power is generated. The power generated by generator 142A energizes the transmitter circuitry 160A, which generates a wireless data signal.

The sensor 140A further provides an indication when the drive mechanism 30A experiences a fault. For example, if the belt 70A were to break, the movement of the lever 118A would cease. As a result, the generator 142A would not generate electrical power, and no wireless data signal would be generated. Similarly, no signal would be generated if the motor 72A experienced a fault that impaired its ability to rotate the drum 14A.

The controller 58A monitors the output of the sensor 140A. If the controller 58A detects the wireless data signal, the controller 58A may continue to operate the dryer 10A according to the selected cycle. If, however, the wireless data signal is not generated or received, the controller 58A may operate the power supply circuit 50A to de-energize the electrical components of the dryer 10A. The controller 58A may also activate an indicator on the control panel 36A to provide an indication of the fault to the user.

As described above, the dryer 10A also includes a flow sensor 222A that is positioned in the duct 174A of the air system 32A. When the dryer 10A is executing a cycle, the blower 170A draws air into the heating duct 172A to be heated by the heating element 176A. Heated air may then be advanced into the drum chamber 20A, where it is circulated into contact with the laundry contained therein. Air may then be drawn into the exit duct 174A through the chute 200A and the passageway 214A. The flow sensor 222A is configured to generate electrical power based on the amount of air flowing through the passageway 214A.

As shown in FIG. 15, when no air is advanced through the passageway 214A, the cantilevered arm 226A of the sensor 222A is in an undeflected position 250A and the generator 230A of the sensor 222A generates no power. In normal operation, when the filter 204A is positioned in the chute 200A and the screen 208A is substantially free of particulates, approximately five to ten percent of the air circulating in the chamber 20A of the drum 14A advances through the passageway 214A, and the cantilevered arm 226A is deflected to a degree of deflection 252A. In that position, the generator 230A generates a quantity of electrical power that indicates the degree of deflection 252A and hence the amount of air flowing through the passageway 214A.

As the screen 208A is covered by lint and other particulates during operation, the amount of air passing into the chute 200A is decreased and additional air is advanced into the passageway 214A. When the screen 208A is substantially covered by lint, the cantilevered arm 226A is deflected to another degree of deflection 254A. In that position, the generator 230A generates a quantity of electrical power that indicates the degree of deflection 254A and hence the amount of air flowing through the passageway 214A.

If the filter 204A is removed from chute 200A and the dryer 10A is activated, the amount of air passing into the chute 200A is not restricted by the screen 208A and is increased. As a result, the amount of air advancing through the passageway 214A is decreased, and the cantilevered arm 226A may be deflected to a degree of deflection 256A that is less than the degrees of deflection 252A, 254A. In that position, the generator 230A generates a quantity of electrical power that indicates the degree of deflection 256A and hence the amount of air flowing through the passageway 214A.

The controller 58A monitors the output of the sensor 222A. If the electrical power output of the sensor 222A is approximately equal to a predetermined amount, thereby indicating the degree of deflection 252A, the controller 58A may continue to operate the dryer 10A according to the selected cycle. If, however, the output of the sensor 222A is greater than a predetermined amount, thereby indicating the deflection 254A, or less than a predetermined amount, thereby indicating the deflection 256A, the controller 58A may operate the power supply circuit 50A to de-energize the electrical components of the dryer 10A. The controller 58A may also activate an indicator on the control panel 36A to provide an indication of the fault to the user.

It should be appreciated that the concepts illustrated above may be applied to other aspects of the operation of an appliance. For example, the output of the drive sensor 140A may be used by the controller 58A to provide an indication of belt tension and thus the load present in the drum 14A. Because the power required to rotate the drum 14A is a function of the weight of the load (and hence a function of the amount of water in the laundry), the controller 58A may utilize the indication of the load to estimate the remaining dry time and adjust the operation of the dryer. Additionally, the controller 58A may be configured to monitor the output of the drive sensor 140A when the dryer 10A is off to determine if something is in the drum 14A. If movement is detected (i.e., the drive sensor 140A generates an output signal), the controller 58A may be configured to provide an indication to the user via the control panel 36A or otherwise disable the dryer 10A until the fault is cleared by the user.

Figure 16:
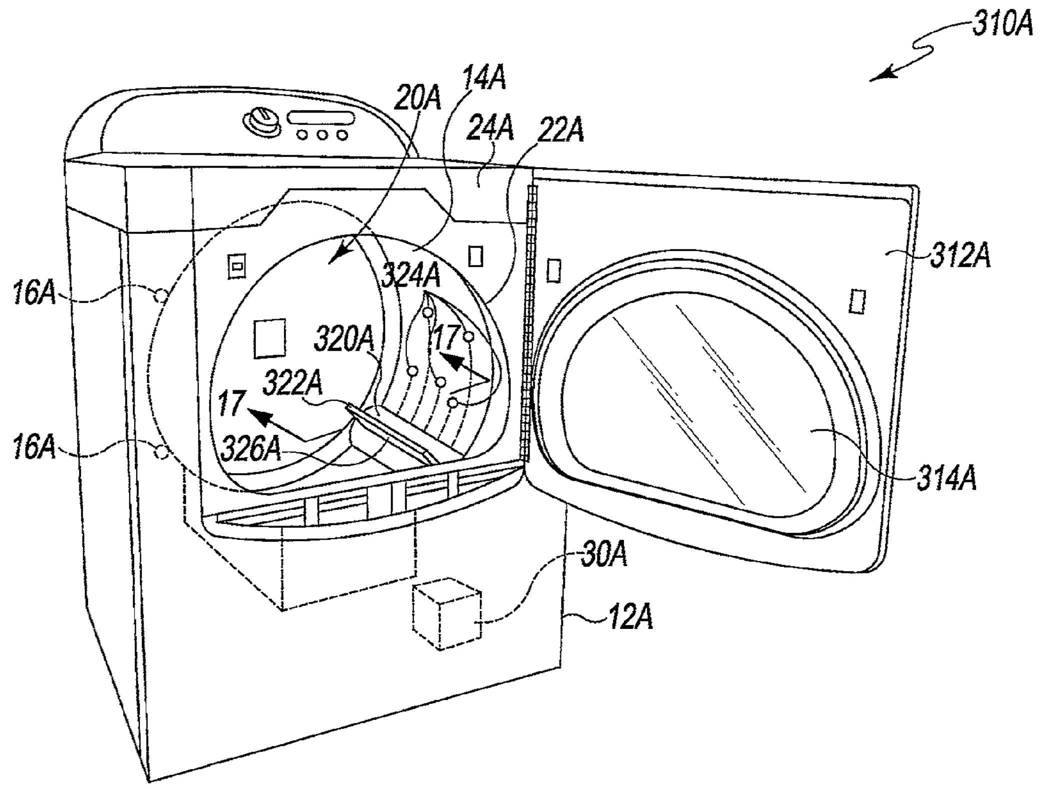
FIG. 16 is a perspective view of another embodiment of a dryer appliance.
Figure 17:
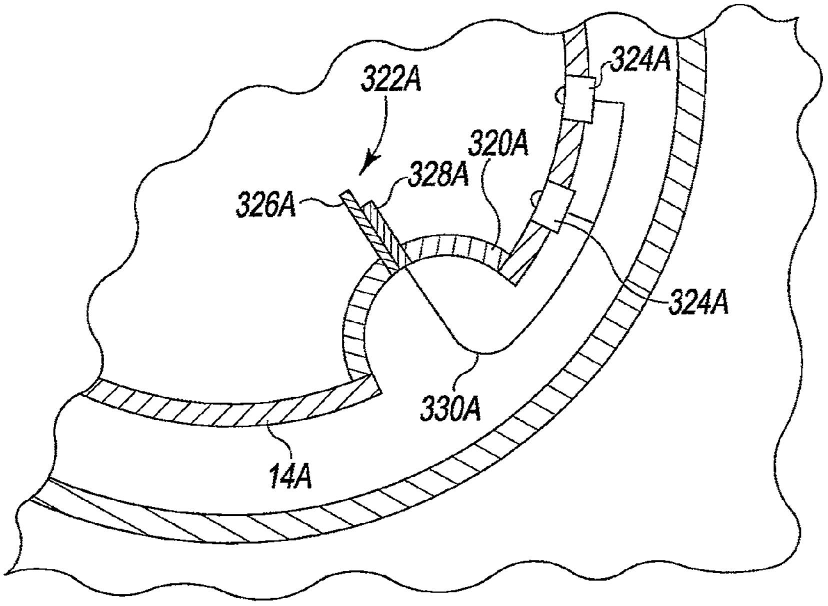
FIG. 17 is a cross-sectional elevation view taken along the line 8-8 of FIG. 16.

Referring now to FIGS. 16 and 17, another embodiment of a dryer (hereinafter dryer appliance 310A) is shown. The dryer 310A is similar to that discussed above with regard to FIGS. 10-15. For ease of description, those structures in FIGS. 16 and 17 that are substantially identical to the structures shown and described above in regard to FIGS. 10-15 are identified with the same reference numbers. As shown in FIG. 16, the dryer 310A includes a cabinet 12A and a drum 14 positioned in the cabinet 12A. The drum 14A is supported by a plurality of roller bearings 16A, which permit the drum 14A to rotate relative to the cabinet 12A. A chamber 20A is defined in the drum 14A and is sized to receive laundry. In use, laundry placed in the chamber 20A is tumbled when the drum 14A is rotated.

The cabinet 12A has an access opening 22A defined in a front panel 24A, and the access opening 22A is sized to permit user access to the drum chamber 20A. A door 312A is hinged to the front panel 24A and is sized to cover the access opening 22A. The door 312A is moveable between the open position shown in FIG. 16 in which user access to the opening 22A is permitted and a closed position in which user access to the opening 22A is prevented. As shown in FIG. 16, the door 312A includes a window 314A that permits the user to see the chamber 20A when the door 312A is closed. In the illustrative embodiment, the window 314A is formed from glass. It should be appreciated that in other embodiments the window 314A may be formed a clear plastic material.

The dryer 310A also includes a drive mechanism 30A that is operable to rotate the drum 14A. As shown in FIG. 16, the drum 14A includes a number of baffles 320A. Each baffle 320A is configured to tumble laundry and other contents of the chamber 20A when the drum 14A is rotated by the drive mechanism 30A. The baffles 320A may be any shape (e.g., blade-shaped or paddle-shaped) suitable for tumbling the laundry.

In the embodiment of FIGS. 16 and 17, the dryer 310A includes a plurality of piezoelectric power generators 322A and a plurality of light sources 324A that are positioned in the chamber 20A. Each light source 324A is secured to the drum 14A and configured to rotate therewith. In other embodiments, one or more of the light sources 324A may be secured to the power generator 322A. Each piezoelectric power generator 322A is secured to the drum 14A and is configured to provide power to the light sources 324A. In the illustrative embodiment, the generators 322A are the exclusive power supplies on the drum 14A such that the light sources 324A do not require power from the power supply circuit (not shown) and hence the AC mains power source.

Each generator 322A includes an elongated arm 326A that extends from a baffle 320A. As shown in FIG. 17, each arm 326A is cantilevered and has a piezoelectric film element 328A positioned thereon. An exemplary film element 328A is the LDT1-028K Piezo Sensor, which is commercially available from Seeed Studio of Shenzhen, China. It should be appreciated that the film element may be formed from a piezoelectric ceramic, such as, for example, lead zirconate titanate (PZT). In other embodiments, the piezoelectric element may also be formed from an electroactive polymer (EAP) such as, for example, a stretchable dielectric elastomer.

When the cantilevered arm 326A is deflected, the corresponding film element 328A is bent, thereby causing the generator 322A to produce power. The piezoelectric film element 328A generates electrical power proportional to the degree of bending; as such, the amount of electrical power generated by the film element 328A is proportional to the amount of deflection of the arm 326A. In the illustrative embodiment, each film element 328A may produce power in the range of approximately 500 μW to 1 Watt. It should be appreciated that the generators 322A may be otherwise shaped and/or coupled to the drum 14A in other embodiments.

The power produced by the generators 322A is supplied to one or more light sources 324A via cable harness 330A. In the illustrative embodiment, each light source 324A is a light emitting diode (LED) operable to product light when energized. It should be appreciated that in other embodiments other sources of light may be used. When energized, each LED is visible through the window 314A of the door 312A. It should be appreciated the LEDs may be arranged in a pattern or aesthetic arrangement on the drum 14A.

During operation, laundry is tumbled in the drum 14A, and the laundry impacts the cantilevered arms 326A extending from the baffles 320A. The force of the impact of the laundry causes the cantilevered arms 326A (and hence the piezoelectric element 328A) to deflect, thereby causing the generator 322A to supply power to the LEDs 324A. The light created by the LEDs 324A is visible through the window 314A to provide a visual indication of the rotation of the drum 14A.

In other embodiments, the generators 322A may be used to power other devices on drum 14A. Additionally, it should be appreciated that in other embodiments one or more of the light sources may be powered through inductance by placing the power source or primary inductor on the cabinet of the dryer. A secondary inductor may be included on the drum to power the light source.

As described above, the dryer includes a number of roller bearing 16A that support the drum 14A. As the drum 14A is rotated during operation, the load on each bearing 16A varies with the movement of the load in the drum 14A. That variation in movement may cause flexing. A piezoelectric device similar to those described above may be mounted between the drum 14A and the cabinet 12A to generate electrical power from the flexing.

A piezoelectric device may also be secured to the dryer feet, which engage the floor and support the dryer 10A. The piezoelectric device would be configured to generate power from the vibration transmitted to the floor. Another piezoelectric device may be integrated into a sensor ball, which is introduced into the drum during operation. The sensor may be charged by tumbling action and used to transmit a wireless signal to the controller. The sensor ball would monitor the dryness levels of the clothes and the acceleration of the ball, which would provide feedback on the tumbling pattern of the clothes and the load size. With that data, the controller could, for example, adjust the rotational speed of the drum to optimize drying. The sensor ball may also be configured to detect differences in gas content to detect fire or combustion.

Although the concepts are described herein with regard to an electric dryer, the concepts described herein may be applied to gas dryers in other embodiments. Additionally, the concepts described herein may be applied to other domestic appliances, such as, for example, a washer for laundry.

Figure 18:
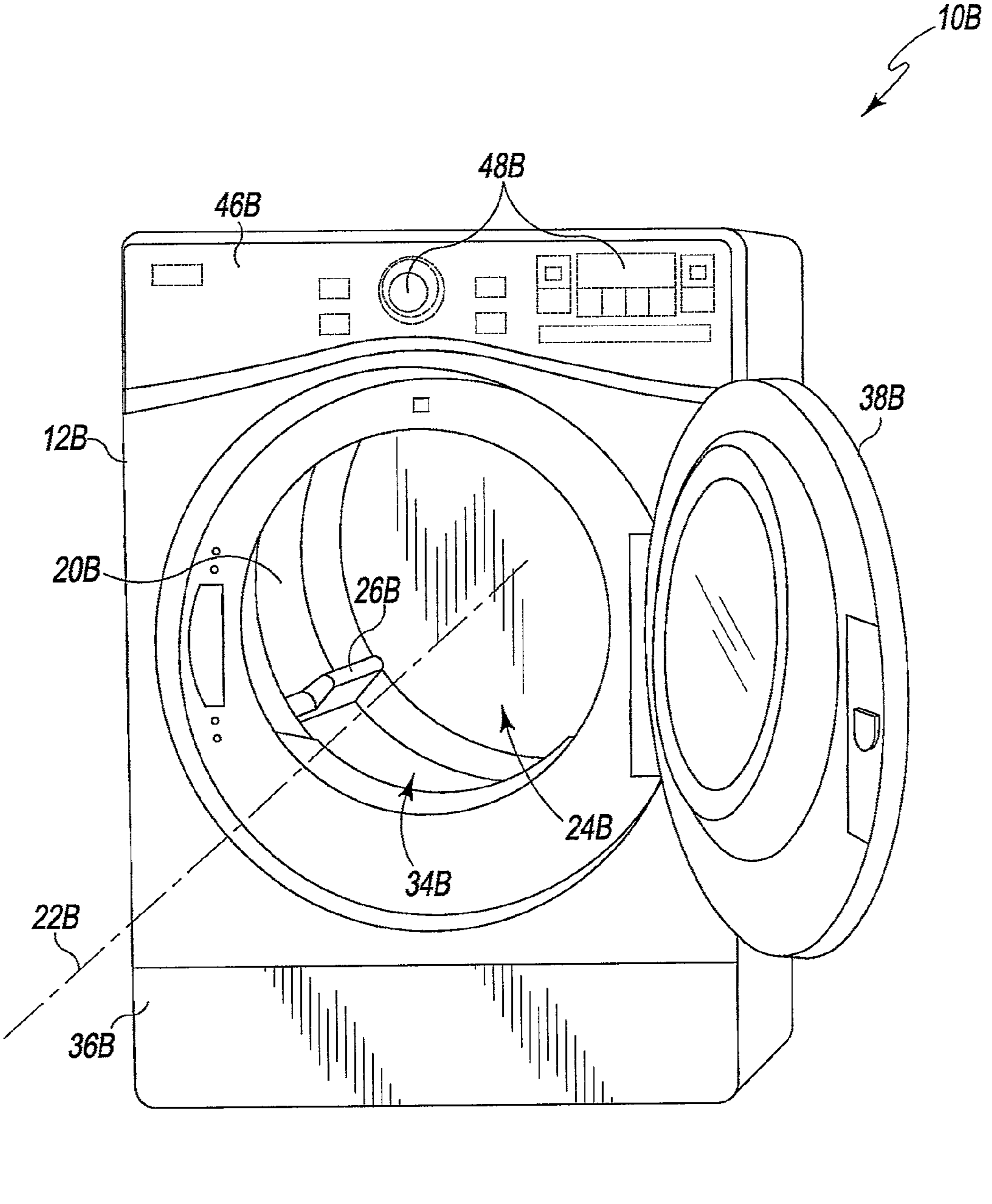
FIG. 18 is a front perspective view of a washer appliance.
Figure 19:
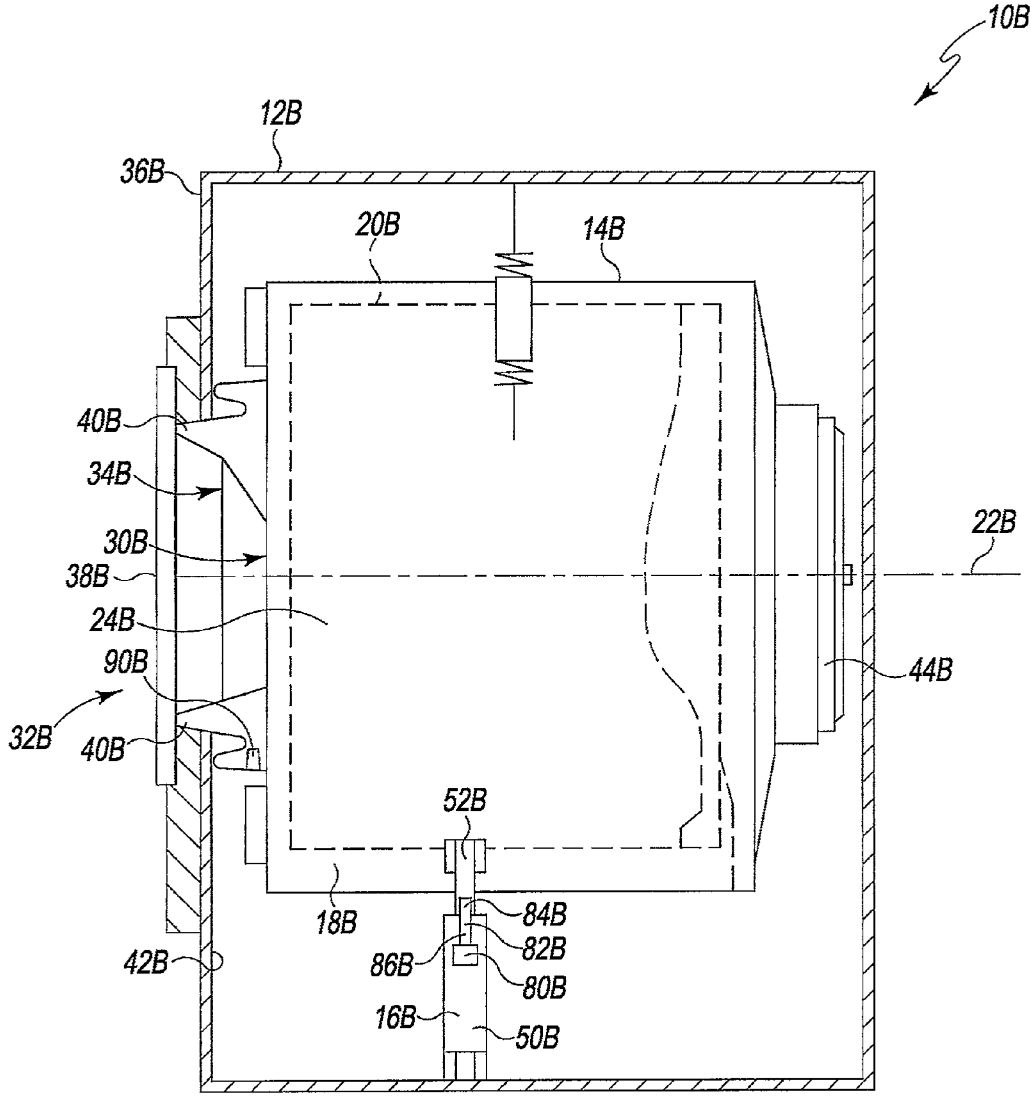
FIG. 19 is a cross-sectional side elevation view of the washer appliance of FIG. 18.

Referring to FIGS. 18-19, a home appliance is shown as a washer appliance 10B (hereinafter washer 10B) for washing laundry. The washer 10B includes a cabinet 12B and a tub 14B positioned in the cabinet 12B. As shown in FIG. 19, the tub 14B is supported within the cabinet 12B by one or more dampers 16B and/or other support structure. The tub 14B includes a chamber or cavity 18B configured to contain a washing fluid for washing the laundry; as described in greater detail below, the cavity 18B is configured to receive washing fluid from an external fluid supply during a wash cycle and drain the fluid upon completion.

A rotating drum 20B is positioned in the cavity 18B of the tub 14B, as shown in FIG. 18. The drum 20B is configured to rotate about a longitudinal axis 22B relative to the tub 14B and therefore the cabinet 12B. A chamber 24B is defined in the drum 20B and is sized to receive laundry to be washed. In the illustrative embodiment, the drum 20B includes a number of baffles 26B. Each baffle 26B is configured to tumble laundry and other contents of the chamber 24B when the drum 20B is rotated about the axis 22B. The baffles 26B may be any shape (e.g., blade-shaped or paddle-shaped) suitable for tumbling the laundry.

The tub 14B of the washer 10B includes an access portal 30B that is defined in a front side 32B thereof. The cabinet 12B has an access opening 34B that is defined in a front panel 36B and is aligned with the portal 30B of the tub 14B. The opening 34B and the portal 30B are sized to permit user access to the drum chamber 24B. A door 38B is hinged to the front panel 36B and is sized to cover the access opening 34B of the cabinet 12B. The door 38B is moveable between the open position shown in FIG. 18 in which user access to the opening 34B is permitted and a closed position in which user access to the opening 34B is prevented. It should be appreciated that in other embodiments the door 38B may be a tiltable door rather than the swinging door shown in FIG. 18.

As shown in FIG. 19, an annular seal 40B extends between the front side 32B of the tub 14B and an inner wall 42B of the cabinet 12B. The annular seal 40B encircles the rear edge of the access opening 34B and the access portal 30B of the tub 14B, thereby preventing leakage of wash fluid. In the illustrative embodiment, the annular seal 40B is a bellows that has an S-shaped cross-section and is formed from an elastomeric material such as, for example, rubber or plastic. It should be appreciated that in other embodiments the seal may be an o-ring seal, gasket, or other structure capable of preventing fluid leakage. During operation, the annular seal 40B stretches or flexes with the movement of the tub 14B, as described in greater detail below.

The washer 10B also includes a drive mechanism 44B that is operable to rotate the drum 20B about the axis 22B. In the illustrative embodiment, the drive mechanism 44B is attached to the tub 14B and includes a motor and a driveshaft that engages the drum 20B. An exemplary drive mechanism is shown and described in U.S. Patent App. Pub. No. 2010/0307202 entitled "WASHING MACHINE WITH A DIRECT DRIVE SYSTEM," which is expressly incorporated herein by reference. It should be appreciated that in other embodiments the drive mechanism may be secured to the cabinet and may be configured to rotate the drum 20B through a drive belt or other transmission. The washer 10B has a control panel 46B that may be utilized to operate the drive mechanism 44B. As shown in FIG. 18, the control panel 46B is positioned on the front panel 36B of the cabinet 12B above the access opening 34B. A plurality of controls 48B are included on the panel 46B such as, for example, buttons, switches, knobs, or screens, which may be used to operate the drive mechanism 44B and the other components of the washer 10B.

As described above, the tub 14B is supported by a number of dampers 16B. As shown in FIG. 19, each damper 16B includes an outer cylinder 50B attached to the cabinet 12B and a rod 52B that extends outwardly from the cylinder 50B and is secured to the tub 14B. In the illustrative embodiment, the rod 52B of the damper 16B is configured to move into and out of the cylinder 50B to damp vibration that is generated during operation of the washer 10B. An exemplary damper is the Washer Damper Shock Absorber Model No. 34001292, which is commercially available from Whirlpool Corporation of Benton Harbor, Mich.

Figure 20:
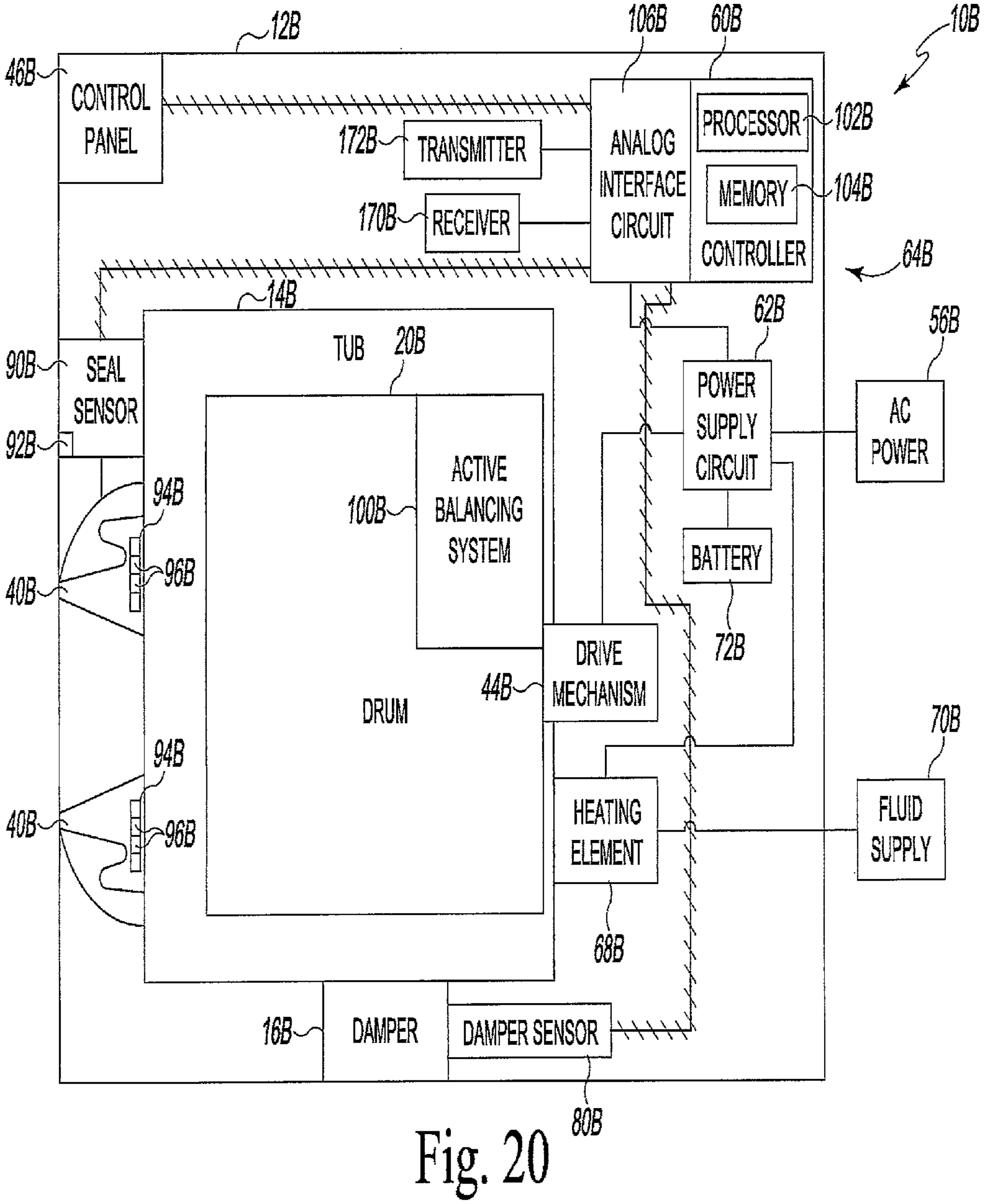
FIG. 20 is a simplified block diagram of the washer appliance of FIG. 18.

Referring now to FIG. 20, a number of the components of the washer 10B are shown in a simplified block diagram. The washer 10B in the illustrative embodiment includes an electronic control unit (ECU) or "electronic controller" 60B, which is configured to control the operation of the washer 10B and a power supply circuit or circuitry 62B that is configured to supply electrical power to the other electrical components 64B of the washer 10B. It should be appreciated that the power supply circuit 62B may include components, sub-components, and devices other than those shown in FIG. 20, which are not illustrated for clarity of the description.

As shown in FIG. 20, the power supply circuitry 62B may be electrically coupled to an AC mains power source 56B, such as, for example, an electrical outlet commonly found in residential homes. The AC mains power source 56B is electrically coupled to a DC power converter of the power supply circuitry 62B via a number of signal paths. These signal paths and other signal paths illustrated in FIG. 20 may be embodied as any type of signal paths capable of communicating electrical signals between the components of the power supply circuitry 62B. For example, the signal paths may be embodied as any number of wires, cables, printed circuit board traces, bus, intervening devices, and/or the like. It should be appreciated, however, that some signal paths have been omitted from FIG. 20 for clarity.

As described above, the power supply circuitry 62B is electrically coupled to a number of the electrical components 64B of the washer 10B. The electrical components 64B may include any number of electrical and/or electromechanical components such as those commonly found in a laundry appliance. For example, in the illustrative embodiment, the electrical components 64B include the drive mechanism 44B and the controller 60B. The electrical components 64B also include a heating element 68B that is configured to heat wash fluid supplied to the tub 14B from an external fluid supply 70B and a battery 72B. The washer 10B may also include various sensors such as, for example, proximity sensors, optical sensors, light sensors, audio sensors, temperature sensors, thermistors, motion sensors, piezoelectric sensors, mold and biological film sensors, and/or other types of sensors. Further, the washer 10B may also include components and/or devices configured to facilitate the use of the sensors.

As shown in FIGS. 19 and 20, the washer 10B includes a damper sensor 80B that is secured to one of the dampers 16B. The sensor 80B includes a piezoelectric power generator 82B that is configured to generate electrical power when the drum 20B is rotated and hence the damper rod 52B is moved relative to the cylinder 50B. In the illustrative embodiment, the generator 82B is formed from an electroactive polymer (EAP) such as, for example, a stretchable dielectric elastomer, which generates electrical power when deformed. In other embodiments, the generator 82B may be formed as a spring or disk from a piezoelectric ceramic, such as, for example, lead zirconate titanate (PZT).

As shown in FIG. 19, the generator 82B has an upper end 84B secured to the damper rod 52B and a lower end 86B secured to the cylinder 50B of the damper 16B. When the damper rod 52B is moved out of the cylinder 50B by the motion of the tub 14B, the generator 82B is stretched. As the generator 82B is stretched, the generator 82B generates electrical power proportional to the amount of deformation. The continuous movement of the damper rod 52B thereby causes the generator 82B to move back and forth between its initial length and its stretched length. The electrical power produced by the generator 82B is supplied to the controller 60B in the form of an electrical signal, which the controller 60B may use to determine the operating frequency of the damper 16B and hence the tub 14B, as described in greater detail below.

As shown in FIGS. 19 and 20, the washer 10B also includes a seal sensor 90B. In the illustrative embodiment, the seal sensor 90B includes a mold detector 92B configured to detect the odor or chemical composition of mold or other biological films on the annular seal 40B. Examples of a mold detector include the CanarIT sensor, which is commercially available from Air Base Systems of Israel, and the sensors shown and described in International Patent App. Pub. No. WO2012/121229 entitled "MICROORGANISM DETECTION SENSOR AND PROCESS FOR MANUFACTURING SAME," which is expressly incorporated herein by reference.

The seal sensor 90B also includes a piezoelectric power generator 94B that is secured to the annular seal 40B. In the illustrative embodiment, the generator 94B includes an array of piezoelectric elements 96B that are attached around the perimeter of the annular seal 40B. As described above, the annular seal 40B flexes and/or stretches during operation of the washer 10B, and each piezoelectric element 96B is configured to generate power when the annular seal 40B is stretched or flexed. In the illustrative embodiment, each piezoelectric element 96B is formed from a piezoelectric ceramic, such as, for example, lead zirconate titanate (PZT), which flexes or bends with the annular seal 40B to generate electrical power. It should be appreciated that in other embodiments the piezoelectric element may also be formed from an electroactive polymer (EAP) such as, for example, a stretchable dielectric elastomer, which generates electrical power when deformed.

As each piezoelectric element 96B is stretched, the generator 94B generates electrical power proportional to the amount of deformation. The continuous flexing and stretching of the annular seal 40B thereby causes the piezoelectric elements 96B to stretch and contract. In the illustrative embodiment, the generator 94B is configured to generate an average quantity of power equal to approximately 1 Watt. It should be appreciated that in other embodiments the power may range from approximately 500 μW to 1 Watt.

The generator 94B is electrically coupled to the detector 92B of the seal sensor 90B and provides the electrical power necessary for the detector 92B to operate. In the illustrative embodiment, the detector 92B is electrically coupled to the electronic controller 60B. The detector 92B is configured to generate an electrical output signal indicative of the presence of mold when powered by the piezoelectric generator 94B. As described in greater detail below, the controller 60B is configured to adjust the operation of the washer 10B based on the signal from the detector 92B. For example, the controller 60B may alert a user of the washer 10B about the presence of mold by, for example, flashing a light on the control panel 46B of the washer 10B. It should be appreciated that in other embodiments the seal sensor 90B may include a wireless transmitter to relay the electrical output signal to the controller 60B.

The electronic controller 60B of the washer 10B is positioned in the cabinet 12B. The electronic controller 60B is, in essence, the master computer responsible for interpreting electrical signals sent by sensors associated with the washer 10B and for activating or energizing electronically-controlled components associated with the washer 10B. For example, the electronic controller 60B is configured to control operation of the various components of the washer 10B, including the drive mechanism 44B, the heating element 68B, and the operation of the power circuit 62B. The electronic controller 60B also monitors various signals from the control panel 46B, the damper sensor 80B, the seal sensor 90B, and the sensors associated with the active balancing system 100B, which are described in greater detail below. The electronic controller 60B also determines when various operations of the washer 10B should be performed. As will be described in more detail below, the electronic controller 60B is operable to control the components of the washer 10B such that the washer 10B solicits user input regarding washer performance and adjusts operational parameters of the washer 10B in response thereto.

To do so, the electronic controller 60B includes a number of electronic components commonly associated with electronic units utilized in the control of electromechanical systems. For example, the electronic controller 60B may include, amongst other components customarily included in such devices, a processor such as a microprocessor 102B and a memory device 104B such as a programmable read-only memory device ("PROM") including erasable PROM's (EPROM's or EEPROM's). The memory device 104B is provided to store, amongst other things, instructions in the form of, for example, a software routine (or routines) which, when executed by the microprocessor 102B, allows the electronic controller 60B to control operation of the washer 10B.

The electronic controller 60B also includes an analog interface circuit 106B. The analog interface circuit 106B converts the output signals from the sensors into signals which are suitable for presentation to an input of the microprocessor 102B. In particular, the analog interface circuit 106B, by use of an analog-to-digital (A/D) converter (not shown) or the like, converts the analog signals generated by the sensors into digital signals for use by the microprocessor 102B. It should be appreciated that the A/D converter may be embodied as a discrete device or number of devices, or may be integrated into the microprocessor 102B. It should also be appreciated that if any one or more of the sensors associated with the washer 10B generate a digital output signal, the analog interface circuit 106B may be bypassed.

Similarly, the analog interface circuit 106B converts signals from the microprocessor 102B into output signals which are suitable for presentation to the electrically-controlled components associated with the washer 10B (e.g., the drive mechanism 44B). In particular, the analog interface circuit 106B, by use of a digital-to-analog (D/A) converter (not shown) or the like, converts the digital signals generated by the microprocessor 102B into analog signals for use by the electronically-controlled components associated with the washer 10B. It should be appreciated that, similar to the A/D converter described above, the D/A converter may be embodied as a discrete device or number of devices, or may be integrated into the microprocessor 102B. It should also be appreciated that if any one or more of the electronically-controlled components associated with the washer 10B operate on a digital input signal, the analog interface circuit 106B may be bypassed.

Thus, the electronic controller 60B may control the operation of the washer 10B. In particular, the electronic controller 60B executes a routine including, amongst other things, a control scheme in which the electronic controller 60B monitors the outputs of the sensors associated with the washer 10B, including the damper sensor 80B, the seal sensor 90B, and the sensors of the active balancing system 100B, to control the inputs to the electronically-controlled components associated therewith. To do so, the electronic controller 60B communicates with the sensors directly or indirectly to determine, amongst numerous other things, the state of the drive mechanism 44B and the heating element 68B. Armed with this data, the electronic controller 60B performs numerous calculations, either continuously or intermittently, including looking up values in preprogrammed tables, in order to execute algorithms to perform such functions as energizing the electric motor of the drive mechanism 44B, energizing the heating element 68B, activating an indicator on the control panel 46B, and so on.

Figure 21:
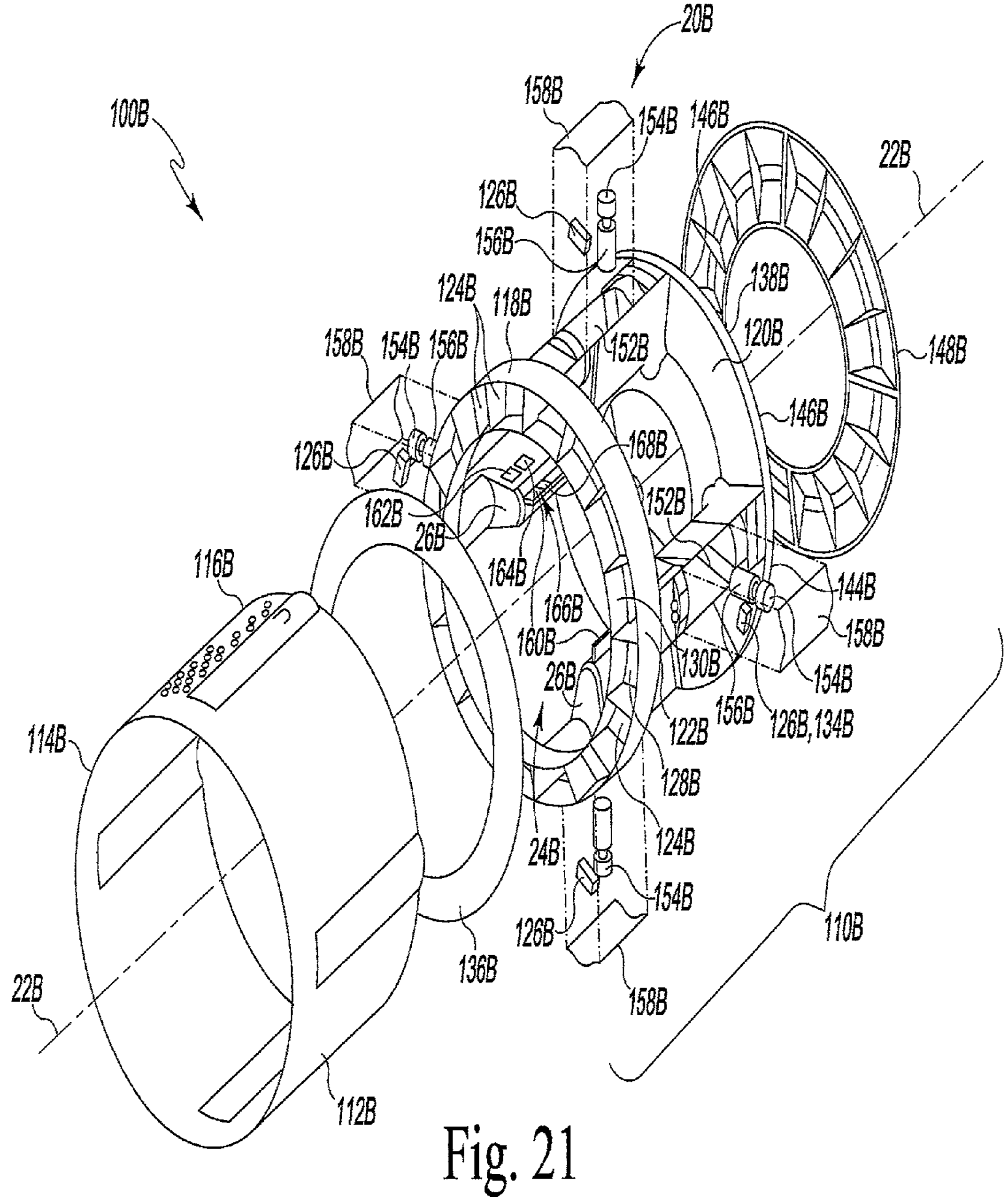
FIG. 21 is an exploded perspective view of one embodiment of an active balancing system of the washer appliance of FIG. 18.

As described above, the washer 10B includes an active balancing system 100B to counteract uneven or unbalanced loads in the drum 20B. Referring now to FIG. 21, the active balancing system 100B includes a fluid-based balance assembly 110B that is integrated into the drum 20B. An exemplary fluid-based balance assembly 110B is shown and described in U.S. Pat. No. 5,913,951 entitled "RADIALLY ORIENTED MOTOR FOR A FLUID BALANCE RING," which is expressly incorporated herein by reference. In the illustrative embodiment, the drum 20B of the washer 10B includes an outer cylindrical shell 112B extending from a front end 114B to a rear end 116B. The balance assembly 110B includes a frame 118B that is positioned in the shell 112B. In the illustrative embodiment, the frame 118B and the shell 112B cooperate to define the chamber 24B of the drum 20B.

As shown in FIG. 21, the frame 118B of the balance assembly 110B includes a base plate 120B and a front ring 122B that is spaced apart from the base plate 120B. The plurality of baffles 26B of the drum 20B extend between the base plate 120B and the front ring 122B. The baffles 26B, the plate 120B, and the front ring 122B are integrally formed as a single monolithic component. It should be appreciated that in other embodiments those structures may be formed separately and later assembled into the frame 118B.

A plurality of compartments 124B are defined in the front ring 122B and enclosed by a front cover 136B. A corresponding plurality of compartments 138B are defined in the base plate 120B and enclosed by a rear cover 148B. In the illustrative embodiment, each pair of compartments 124B is interconnected by a solenoid valve 126B, which may be actuated to permit fluid to move between those compartments. Similarly, each pair of compartments 138B is interconnected by a solenoid valve 126B, which may be actuated to permit fluid to move between those compartments. In the illustrative embodiment, each pair of compartments 138B corresponds to a pair of compartments 124B of the front ring 122B. Additionally, a single solenoid 126B may be operated to interconnect two compartments 124B and separately interconnect two compartments 138B. In that way, fluid is moved between two compartments 124B in the front ring 122B at the same time fluid is moved between the corresponding two compartments 138B in the base plate 120B.

As shown in FIG. 21, an outer chamber 152B is defined in each baffle 26B of the frame 118B. Each outer chamber 152B houses a solenoid valve 126B, a pump 154B, and a motor 156B that is coupled to the pump 154B. Additionally, each baffle 26B includes a cover 158B to seal the outer chamber 152B against fluid leakage. In the illustrative embodiment, each motor 156B is operable to drive the pump 154B to move fluid between a pair of compartments 124B and to move fluid between a pair of compartments 138B when the corresponding solenoid valve 126B is in the open position. The controller 60B is operable to control the motors 156B and the solenoid valves 126B to move fluid between the compartments 124B and between the components 138B to actively balance the weight distribution of the drum 20B during the operation of the washer 10B. It should be appreciated that, in some embodiments, actuators other than the solenoid valves 134B may be used. For example, linear actuators that use small amounts of power (e.g., muscle wire) may be used.

In the illustrative embodiment, the front ring 122B includes a compartment 128B that is connected to a compartment 130B via a solenoid valve 134B. Further, the base plate 120B includes a compartment 144B that is connected to a compartment 146B via the same solenoid valve 134B that connects the compartments 128B, 130B in the front ring 122B. Each solenoid valve 126B includes an armature (not shown) configured to move between an open position and a closed position, such that the solenoid valve 126B permits fluid to pass between, for example, the compartments when in the open position and prevents the passage of fluid when in the closed position. In the illustrative embodiment, when the solenoid valve 134B is actuated, fluid is permitted to advance from the compartment 128B to the compartment 130B and back again. At the same time, fluid is permitted to advance from the compartment 144B to the compartment 146B and back again to balance the load.

The active balancing system 100B includes a plurality of piezoelectric power generators 160B that are secured to the drum 20B and are configured to provide power on the drum 20B. In the illustrative embodiment, the generators 160B are the exclusive power supplies on the drum 20B and are configured to provide power to the solenoid valves 126B, the pumps 154B, the motors 156B, transmitter circuitry 162B, and receiver circuitry 164B positioned on the drum 20B. In that way, those electrical components do not require power from the power supply circuit 62B (and hence the AC mains power source 56B).

Each generator 160B includes an elongated arm 166B that extends from a baffle 26B. Each arm 166B is cantilevered and has a piezoelectric film element 168B positioned thereon. An exemplary film element 168B is the LDT1-028K Piezo Sensor, which is commercially available from Seeed Studio of Shenzhen, China. It should be appreciated that the film element may be formed from a piezoelectric ceramic, such as, for example, lead zirconate titanate (PZT). In other embodiments, the piezoelectric element may also be formed from an electroactive polymer (EAP) such as, for example, a stretchable dielectric elastomer.

When laundry and fluid are circulated in the drum 20B, the force of the laundry and fluid causes the cantilevered arm 166B to deflect. When the cantilevered arm 166B is deflected, the corresponding film element 168B is bent, thereby causing the generator 160B to produce power. The piezoelectric film element 168B generates electrical power proportional to the degree of bending; as such, the amount of electrical power generated by the film element 168B is proportional to the amount of deflection of the arm 166B. In the illustrative embodiment, each film element 168B may produce power in the range of approximately 500 μW to 1 Watt. It should be appreciated that the generators 160B may be otherwise shaped and/or coupled to the drum 20B in other embodiments.

The power generated by the elements 168B is supplied to the transmitter circuitry 162B and the receiver circuitry 164B positioned on the drum 20B. The transmitter circuitry 162B is configured to transmit a wireless data signal when energized. In the illustrative embodiment, the transmitter circuitry 162B uses a Bluetooth transmission protocol. The electrical power generated by the generators 160B energizes the transmitter circuitry 162B such that the wireless data signal is transmitted. Similarly, the receiver circuitry 164B of the system 100B is configured to receive wireless data signals when energized. In the illustrative embodiment, the receiver circuitry 164B also uses a Bluetooth transmission protocol.

As shown in FIG. 20, the washer 10B includes receiver circuitry 170B that is not positioned on the drum 20B and configured to receive the data signals generated by the transmitter circuitry 162B. For example, the receiver circuitry 170B may be positioned in the cabinet 12B outside of the drum 20B. In the illustrative embodiment, the receiver circuitry 170B is configured to use the Bluetooth transmission protocol. It should be appreciated that the receiver circuitry 170B may be embodied as any type of wireless receiver capable of receiving the data signals from the transmitter circuitry 162B. For example, the wireless receiver may be embodied as a wireless router. The receiver circuitry 170B is communicatively coupled to the electronic controller 60B via a number of communication links such as wires, cables, or the like.

The washer 10B also includes transmitter circuitry 172B that is not positioned on the drum 20B and communicatively coupled to the electronic controller 60B via a number of communication links. Like the receiver circuitry 170B, the transmitter circuitry 172B may be positioned in the cabinet 12B outside of the drum 20B. In the illustrative embodiment, the transmitter circuitry 172B is configured to use the Bluetooth transmission protocol and is configured to transmit signals to the receiver circuitry 164B of the system 100B. It should be appreciated that the transmitter circuitry 172B may be embodied as any type of wireless transmitter capable of sending data signals to the receiver circuitry 164B of the balancing system 100B.

In use, a user may open the door 38B to place laundry in the chamber 24B of the drum 20B and utilize the control panel 46B to select a laundry cycle and activate the washer 10B. In response to a user input from the control panel 46B, the controller 60B may operate various electrical components of the washer 10B to execute the cycle. The controller 60B may operate the power supply circuit 62B to energize the drive mechanism 44B. As described above, when the drive mechanism 44B is energized, the drum 20B is rotated relative to the tub 14B about the axis 22B.

The rotation of the drum 20B causes the tub 14B to vibrate. As described above, the tub 14B is supported by a number of dampers 16B to damp vibration of the tub 14B. The damper rod 52B moves into and out of the damper cylinder 50B based on the vibration of the tub 14B. Further, as described above, a piezoelectric power generator 82B is coupled to the damper 16B. As the generator 82B is moved back and forth between its initial length and its stretched length, the generator 82B generates electrical power, which is supplied to the controller 60B in the form of an electrical signal. The controller 60B may use the signal to determine, for example, the operating frequency of the damper 16B and hence the tub 14B.

The rotation of the drum 20B also causes the seal 40B to stretch or flex due to the movement of the tub 14B. The piezoelectric power generator 94B secured to the seal 40B generates power when the seal 40B is stretched or flexed. As described above, the generator 94B may be electrically coupled to a mold detector 92B, which detects the odor or chemical composition of mold or other biological films on the seal 40B. The generator 94B provides the electrical power necessary for the detector 92B to operate. The detector 92B transmits an electrical output signal indicative of the presence of mold to the controller 60B when mold is detected. In response to the detection of mold, the controller 60B may, for example, activate an alarm on the control panel 46B to notify the user of the mold.

The rotation of the drum 20B may also be used to generate power for the active balancing system 100B. As described above, a plurality of baffles 26B extend between the base plate 120B and the front ring 122B of the drum 20B. A number of piezoelectric power generators 160B are secured to the drum 20B (e.g., to the baffles 26B). When laundry and fluid are circulated in the drum 20B, the force of the laundry and fluid applied to the generators 160B causes the generators 160B to deflect and, therefore, to produce power. The power generated by the generators 160B may be used to provide power to electrical components positioned on the drum 20B such as the solenoid valves 126B, the pumps 154B, the motors 156B, transmitter circuitry 162B, and receiver circuitry 164B.

The transmitter circuitry 162B and the receiver circuitry 164B operate in tandem to communicate with electrical components not positioned on the drum 20B such as the controller 60B. For example, the transmitter circuitry 162B may provide sensor data to the controller 60B for analysis. The controller 60B may determine that the drum 20B is unbalanced based on the analysis. For example, a greater displacement of one or more of the dampers 16B may indicate a greater amount of unbalance. In another embodiment, the damper sensor 80B may include a strain gauge or other force gauge to measure the force exerted on the damper 16B by the tub 14B, which may be used to measure the amount of unbalance of the washer 10B. In response to determining the drum 20B is unbalanced, the controller 60B transmits instructions to the receiver circuitry 164B regarding an action to be performed to achieve balance. For example, the controller 60B may operate a number of solenoid valves 126B to open the valves 126B and allow fluid to flow between the corresponding pairs of compartments 124B, 138B. The controller 60B may then energize the corresponding motors 156B to operate the pumps 154B to pump the fluid between the pairs of compartments 124B. Meanwhile, the transmitter circuitry 162B continues to provide sensor data to the controller 60B. When the controller 60B determines that balance has been achieved, the controller 60B stops operation of the solenoid valves 126B and the motors 156B. It should be appreciated that a battery may be positioned on the drum 20B and configured to store power generated by the generators 160B but not used by the electrical components positioned on the drum 20B. Further, the battery may supply power to the electrical components when the amount of power supplied by the generators 160B is insufficient to operate the electrical components.

Figure 22:
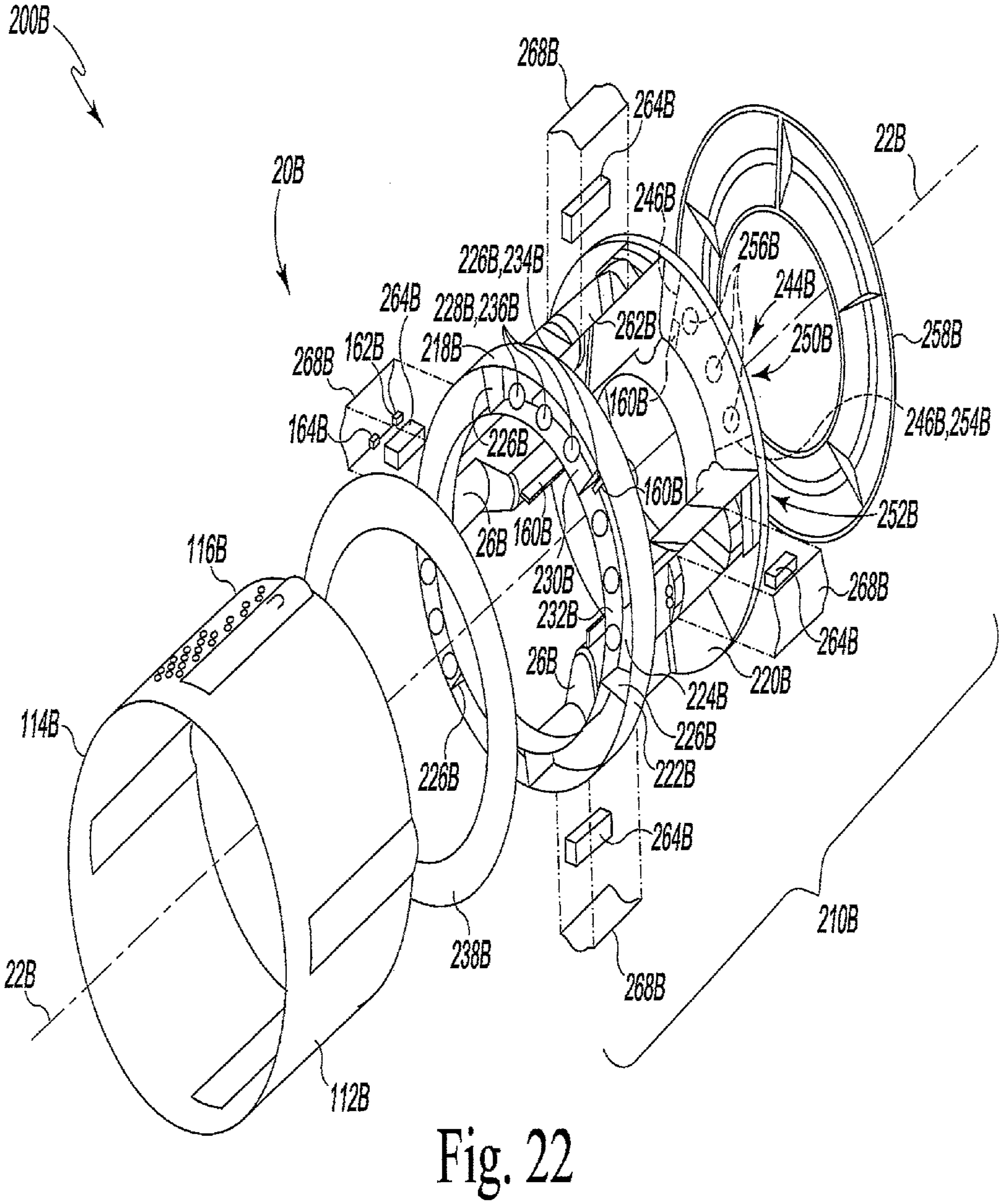
FIG. 22 is an exploded perspective view of another embodiment of an active balancing system of the washer appliance of FIG. 18.

Referring now to FIG. 22, the washer 10B may include another embodiment of an active balancing system (hereinafter system 200B) similar to that discussed above with regard to FIG. 21. For ease of description, those structures in FIG. 22 that are substantially identical to the structures shown and described above in regard to FIG. 21 are identified with the same reference numbers. As shown in FIG. 22, the active balancing system 200B includes a mass-based balance assembly 210B that is integrated into the drum 20B. The drum 20B of the washer 10B includes an outer cylindrical shell 112B extending from a front end 114B to a rear end 116B. The balance assembly 210B includes a frame 218B that is positioned in the shell 112B. In the illustrative embodiment, the frame 218B and the shell 112B cooperate to define the chamber 24B of the drum 20B.

As shown in FIG. 22, the frame 218B of the balance assembly 210B includes a base plate 220B and a front ring 222B that is spaced apart from the base plate 220B. The plurality of baffles 26B of the drum 20B extend between the base plate 220B and the front ring 222B. The baffles 26B, the plate 220B, and the front ring 222B are integrally formed as a single monolithic component. It should be appreciated that in other embodiments those structures may be formed separately and later assembled into the frame 218B.

A plurality of compartments 224B are defined in the front ring 222B. In the illustrative embodiment, each pair of compartments 224B is interconnected by a solenoid-operated gate 226B. Each compartment 224B is sized to receive a number of rolling mass elements 228B, which are illustratively embodied as spheres. It should be appreciated that in other embodiments the mass elements 228B may be embodied as cylindrical pins or other shapes that permit mass elements 228B to roll within and between the compartments 224B. The solenoid-operated gate 226B may be actuated to permit the mass elements 228B to move between each pair of compartments 224B.

For example, the compartments 224B include a compartment 230B that is connected to a compartment 232B via a solenoid-operated gate 234B. The gate 234B may be actuated to permit mass elements 236B to advance from the compartment 230B to the compartment 232B and back again. In the illustrative embodiment, each gate 234B is configured to move between an open position and a closed position, such that the gate 234B permits mass elements 236B to pass between, for example, the compartments 230B, 232B, when in the open position and prevents the mass elements 236B from passing when in the closed position. As shown in FIG. 22, the compartments 224B are enclosed by a front cover 238B.

A plurality of compartments 244B are defined in the base plate 220B. In the illustrative embodiment, each pair of compartments 244B is interconnected by a solenoid-operated gate 246B. Additionally, each pair of compartments 244B corresponds to a pair of compartments 224B of the front ring 122B. Each compartment 244B is sized to receive a number of rolling mass elements 228B. The solenoid-operated gate 246B may be actuated to permit the mass elements 228B to move between each pair of compartments 244B.

For example, the compartments 244B include a compartment 250B that is connected to a compartment 252B via a solenoid-operated gate 254B. The gate 254B may be actuated to permit mass elements 256B to advance from the compartment 250B to the compartment 252B and back again. In the illustrative embodiment, each gate 254B is configured to move between an open position and a closed position, such that the gate 254B permits the mass elements 256B to pass between, for example, the compartments 250B, 252B, when in the open position and prevents the passage of the mass elements 256B when in the closed position. As shown in FIG. 22, the compartments 224B are enclosed by a rear cover 258B.

As shown in FIG. 22, an outer chamber 262B is defined in each baffle 26B of the frame 218B. Each outer chamber 262B houses a solenoid valve 264B configured to operate one of the gates 226B of the front ring 222B and the corresponding gate 234B of the base plate 220B. Each baffle 26B includes a cover 268B to seal the outer chamber 262B against fluid leakage.

The active balancing system 200B includes a plurality of piezoelectric power generators 160B that are secured to the drum 20B and are configured to provide power on the drum 20B. In the illustrative embodiment, the generators 160B are the exclusive power supplies on the drum 20B and are configured to provide power to the solenoid valves 264B, transmitter circuitry 162B, and receiver circuitry 164B positioned on the drum 20B. In that way, those electrical components do not require power from the power supply circuit 62B (and hence the AC mains power source 56B). In some embodiments, the generators 160B are additionally configured to provide power to motors that move the mass elements 228B to accomplish active balancing.

In the illustrative embodiment, piezoelectric power generators 160B generate electrical power to operate the valves 264B. As described above, the generators 160B may be mounted on the baffles 26B. However, in another embodiment, the generators 160B may be mounted inside the compartments 224B, 244B and may generate electrical power as the mass elements 228B roll therethrough. For example, the generators 160B may be embodied as cantilever beams positioned at the gates 226B and configured to deflect as the mass elements 228B roll through the compartments 224B, 244B and apply a force to the generators 160B.

In response to determining the drum 20B is unbalanced, the controller 60B transmits instructions to the receiver circuitry 164B regarding an action to be performed to achieve balance. For example, the controller 60B may operate a number of solenoid valves 264B to open a number of the gates 234B, 246B and permit the mass elements 236B, 256B between the corresponding pairs of compartments 224B, 244B, respectively. Meanwhile, the transmitter circuitry 162B continues to provide sensor data to the controller 60B. When the controller 60B determines that balance has been achieved, the controller 60B stops operation of the solenoid valves 264B, thereby closing the gates 234B, 246B and trapping the mass elements 236B, 256B within the compartments. In some embodiments, the controller 60B may instruct the valves 264B to stay closed until a certain threshold frequency is reached (e.g., 300 rotations per minute) to improve functionality of the system.

It should be appreciated that the concepts illustrated above may be applied to other aspects of the operation of an appliance. For example, a piezoelectric power generator may be secured to a fluid inlet of the washer 10B to generate electrical power as the water flows into the tub 14B under pressure during a wash cycle. The power generated by such a generator may be used in conjunction with one or more electrical components 64 (e.g., sensors) for a variety of functions. For example, a sensor may be placed in the fluid inlet and act as a flow totaler and/or used as a safety device to cut-off filling the tub 14B in the event of a leak.

Alternatively or additionally, the piezoelectric generator may be mounted to the drum 20B and/or the baffles 26B and may power a sensor used to sense the existence of a water ring or suds condition during a wash cycle. In some embodiments, the generator itself may be used to sense the amount of water and suds. It should be appreciated that the generator would have a different amount of flex as it rotates through water than through suds due to the different forces applied by those substances. As such, the generator would generate a different amount of power based on the substance through which it is passed. In another embodiment, the generator may (e.g., in conjunction with a sensor) sense suds on the door 38B of the washer 10B. In such an embodiment, the generator may be mounted on a hinge of the door 38B and generate electrical power as the door 38B is opened and closed. The generator may power a sensor used to measure, for example, the pressure, the reflectance, and/or capacitance of suds on the door 38B.

As described above, the washer 10B includes a number of piezoelectric generators 160B that flex as they engage the contents of the washer 10B such as laundry and washing fluid. In some embodiments, the generator 160B may be electrically coupled to a sensor that detects the amount of flex. This data may be transmitted (e.g., via a transmitter 162B) to the controller 60B, and the controller 60B may determine the load size, load type, speed of the drum 20B, fluid level, and/or efficiency of energy transfer.

In another embodiment, piezoelectric power generators may power sensors used to determine the bending moment on the drive shaft of the washer 10B, which is an indication of the forces in the bearings and a rear portion of the tub 14B. To do so, the sensors may monitor the displacement of the dampers 16B and the relationship between the front dampers 16B and the rear dampers 16B of the washer 10B. If the load size is known, it may be used by the controller 60B to determine if the bending moment has been exceeded.

It should be appreciated that at high speeds, the side walls of the tub 14B deflect, thereby causing the tub to become elliptical due to the flexing. As such, a piezoelectric generator may be mounted on the tub 14B and used to generate electrical power during high spin speeds of the drum 20B and to sense the amount of laundry not in balance at those speeds (e.g., using a sensor). Although the concepts are described herein with regard to horizontal axis washers, the concepts described herein may be applied to vertical axis washers in other embodiments. Additionally, the concepts described herein may be applied to other domestic appliances, such as, for example, a dryer for laundry.

There are a plurality of advantages of the present disclosure arising from the various features of the method, apparatus, and system described herein. It will be noted that alternative embodiments of the method, apparatus, and system of the present disclosure may not include all of the features described yet still benefit from at least some of the advantages of such features. Those of ordinary skill in the art may readily devise their own implementations of the method, apparatus, and system that incorporate one or more of the features of the present invention and fall within the spirit and scope of the present disclosure.

The invention claimed is:

1. A refrigerator comprising:

a cabinet defining a temperature-controlled compartment;

a door positioned at a front of the cabinet, the door being moveable between (i) an open position in which user-access to the temperature-controlled compartment is permitted, and (ii) a closed position in which user-access to the temperature-controlled compartment is prevented; and a sensor including a unitary body having a first portion directly secured to a panel of the door and a second portion secured to the cabinet in both the open and closed positions, wherein the sensor includes a first piezoelectric device configured to generate electrical power when the door is moved from the open position to the closed position.

2. The refrigerator of claim 1, wherein the sensor further includes a wireless transmitter electrically coupled to the first piezoelectric device, wherein the first piezoelectric device is configured to supply electrical power to the wireless transmitter when the door is moved between the open position and the closed position.

3. The refrigerator of claim 1, further comprising:

an electrical power generator including a second piezoelectric device extending between the door and the cabinet, the second piezoelectric device being configured to generate electrical power when the door is moved from the closed position to the open position.

4. The refrigerator of claim 3, wherein the second piezoelectric device includes a second body formed from a stretchable dielectric elastomer.

5. The refrigerator of claim 4, wherein the first body or the second body has (i) a first length when the door is closed, and (ii) a second length when the door is open, the second length being greater than the first length.

6. The refrigerator of claim 3, wherein the first or second piezoelectric device includes a piezoelectric film element.

7. The refrigerator of claim 3, further comprising:

a battery, wherein the second piezoelectric device is configured to supply electrical power to the battery when the door is moved from the closed position to the open position.

8. A domestic appliance comprising:

a cabinet defining a compartment;

a light source positioned in the compartment;

a door positioned at a front of the cabinet, the door being moveable between (i) an open position in which user-access to the compartment is permitted, and (ii) a closed position in which user-access to the compartment is prevented;

a sensor including a unitary body having a first portion directly secured to a panel of the door and a second portion secured to the cabinet in both the open and closed positions, the sensor includes (i) a transmitter configured to generate an electrical signal when supplied with electrical power, (ii) a piezoelectric device configured to supply electrical power to the transmitter when the door is in the closed position; and a receiver configured to receive the electrical signal generated by the transmitter; and an electronic controller coupled to the receiver and the light source, wherein the controller is configured to (i) detect the electrical signal from the transmitter and (ii) de-energize the light source when the electrical signal is detected.

9. The domestic appliance of claim 8, further comprising an electrical power generator including a second piezoelectric device extending between the door and the cabinet, the second piezoelectric device being configured to generate electrical power when the door is moved from the closed position to the open position, and a power supply circuit being operable to distribute electrical power generated by the electrical power generator to the light source.

10. The domestic appliance of claim 9, wherein the controller is coupled to the power supply circuit and is configured to operate the power supply circuit to supply electrical power to the light source when the electrical signal is absent.

11. The domestic appliance of claim 9, further comprising a battery coupled to the power supply circuit, and the controller is coupled to the power supply circuit and is configured to operate the power supply circuit to supply electrical power to the battery.

12. The domestic appliance of claim 9, wherein the second piezoelectric device includes a body formed from a stretchable dielectric elastomer.

13. A method of operating a refrigerator appliance, comprising:

deflecting a piezoelectric device positioned on a door of the refrigerator appliance to generate a quantity of electrical power, wherein the piezoelectric device includes a unitary body having a first portion coupled to a cabinet panel and a second portion coupled to a door panel, the second portion maintaining contact with a lateral exterior surface of the refrigerator appliance when the door is disposed in open and closed positions;

communicating with a sensor to determine the quantity of electrical power generated by the piezoelectric device; and operating a light source of the refrigerator appliance based on the quantity of electrical power.

14. The method of claim 13, wherein operating the light source of the refrigerator appliance based on the quantity of electrical power includes de-energizing the light source when the quantity of electrical power is less than a predetermined value.

15. The method of claim 13, wherein the sensor wirelessly transmits a signal to a receiver when the piezoelectric device detects a predetermined value of electrical power is generated.

16. The method of claim 13, wherein the piezoelectric device is coupled to an exterior surface of the cabinet panel on the first portion and an exterior surface of the door panel on the second portion.

17. The method of claim 13, wherein the first portion is aligned with a lateral exterior surface of the cabinet when the door is in the closed position and the first portion faces a front surface of the cabinet when the door is in the open position.

* * * * *